(12) United States Patent
Tanaka

(10) Patent No.: US 8,508,717 B2
(45) Date of Patent: *Aug. 13, 2013

(54) ILLUMINATION OPTICAL SYSTEM, EXPOSURE APPARATUS, AND DEVICE MANUFACTURING METHOD

(75) Inventor: Hirohisa Tanaka, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/484,051

(22) Filed: May 30, 2012

(65) Prior Publication Data

US 2012/0236284 A1     Sep. 20, 2012

Related U.S. Application Data

(62) Division of application No. 12/252,283, filed on Oct. 15, 2008, now Pat. No. 8,462,317.

(60) Provisional application No. 60/960,949, filed on Oct. 22, 2007.

(30) Foreign Application Priority Data

Oct. 16, 2007  (JP) ................................ 2007-269189

(51) Int. Cl.
*G02B 5/02* (2006.01)
*G03B 27/32* (2006.01)
*G03B 27/54* (2006.01)
*G03B 27/72* (2006.01)

(52) U.S. Cl.
USPC ............... 355/71; 355/67; 355/77; 359/599; 359/904

(58) Field of Classification Search
USPC ...... 250/492.2; 355/53, 67, 71, 77; 359/599, 359/707, 904

See application file for complete search history.

(56) References Cited

U.S. PATENT DOCUMENTS

| | | | |
|---|---|---|---|
| 4,346,164 A | 8/1982 | Tabarelli et al. |
| 5,153,428 A | 10/1992 | Ellis |
| 5,216,541 A | 6/1993 | Takesue et al. |
| 5,251,222 A | 10/1993 | Hester et al. |
| 5,312,513 A | 5/1994 | Florence et al. |
| 5,383,000 A | 1/1995 | Michaloski et al. |

(Continued)

FOREIGN PATENT DOCUMENTS

| | | |
|---|---|---|
| CN | 1501175 A | 6/2004 |
| CN | 1573571 A | 2/2005 |

(Continued)

OTHER PUBLICATIONS

Jan. 15, 2009 International Search Report issued in International Application No. PCT/JP2008/068319.

(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

An illumination optical system for illuminating an irradiated plane M with illumination light provided from a light source includes a spatial light modulator, which is arranged in an optical path of the illumination optical system and forms a desired light intensity distribution at a pupil position of the illumination optical system or a position optically conjugated with the pupil position, and a diffuser, which is arranged at an incidence side of the spatial light modulator through which the illumination light enters.

21 Claims, 6 Drawing Sheets

(56) References Cited

U.S. PATENT DOCUMENTS

| | | |
|---|---|---|
| 5,461,410 A | 10/1995 | Venkateswar et al. |
| 5,850,310 A | 12/1998 | Schweizer |
| 5,991,009 A | 11/1999 | Nishi et al. |
| 6,406,148 B1 | 6/2002 | Marshall et al. |
| 6,466,304 B1 | 10/2002 | Smith |
| 6,577,379 B1 | 6/2003 | Boettiger et al. |
| 6,577,429 B1 | 6/2003 | Kurtz et al. |
| 6,665,119 B1 | 12/2003 | Kurtz et al. |
| 6,737,662 B2 | 5/2004 | Mulder et al. |
| 6,819,490 B2 | 11/2004 | Sandström et al. |
| 6,829,090 B2 | 12/2004 | Katsumata et al. |
| 6,844,927 B2 | 1/2005 | Stokowski et al. |
| 6,885,493 B2 | 4/2005 | Ljungblad et al. |
| 6,891,655 B2 | 5/2005 | Grebinski et al. |
| 6,900,915 B2 | 5/2005 | Nanjyo et al. |
| 6,913,373 B2 | 7/2005 | Tanaka et al. |
| 6,958,806 B2 | 10/2005 | Mulder et al. |
| 6,958,867 B2 | 10/2005 | Ohmori et al. |
| 6,960,035 B2 | 11/2005 | Okazaki et al. |
| 6,961,116 B2 | 11/2005 | Den Boef et al. |
| 6,977,718 B1 | 12/2005 | LaFontaine |
| 7,015,491 B2 | 3/2006 | Eurlings et al. |
| 7,030,962 B2 | 4/2006 | Iizuka et al. |
| 7,061,226 B2 | 6/2006 | Dürr |
| 7,095,481 B2 | 8/2006 | Morohoshi |
| 7,095,546 B2 | 8/2006 | Mala et al. |
| 7,095,921 B2 | 8/2006 | Okazaki et al. |
| 7,116,403 B2 | 10/2006 | Troost et al. |
| 7,121,740 B2 | 10/2006 | Okazaki et al. |
| 7,130,021 B2 | 10/2006 | Kobayashi |
| 7,130,120 B2 | 10/2006 | Katsumata et al. |
| 7,148,952 B2 | 12/2006 | Eurlings et al. |
| 7,177,012 B2 | 2/2007 | Bleeker et al. |
| 7,193,684 B2 | 3/2007 | Iizuka et al. |
| 7,259,827 B2 | 8/2007 | Dierichs |
| 7,289,276 B2 | 10/2007 | Ohmori et al. |
| 7,400,382 B2 | 7/2008 | Baba-Ali et al. |
| 7,423,731 B2 | 9/2008 | Tanitsu et al. |
| 7,508,492 B2 | 3/2009 | Sekigawa et al. |
| 7,525,642 B2 | 4/2009 | Mulder et al. |
| 7,532,378 B2 | 5/2009 | Tanaka et al. |
| 7,542,129 B2 | 6/2009 | Sandström |
| 7,551,261 B2 | 6/2009 | Fiolka |
| 7,573,052 B2 | 8/2009 | Inoue et al. |
| 7,573,564 B2 | 8/2009 | Ruff et al. |
| 7,580,559 B2 | 8/2009 | Latypov et al. |
| 7,605,386 B2 | 10/2009 | Singer et al. |
| 7,701,555 B2 | 4/2010 | Arai |
| 7,714,983 B2 | 5/2010 | Koehler et al. |
| 7,965,380 B2 | 6/2011 | Bleeker et al. |
| 8,018,589 B2 | 9/2011 | Mackinnon et al. |
| 2003/0071204 A1 | 4/2003 | Sandstrom et al. |
| 2003/0098959 A1 | 5/2003 | Hagiwara et al. |
| 2003/0214571 A1 | 11/2003 | Ishikawa et al. |
| 2004/0053148 A1 | 3/2004 | Morohoshi |
| 2004/0057034 A1 | 3/2004 | Zinn et al. |
| 2004/0100629 A1 | 5/2004 | Stokowski |
| 2004/0108467 A1 | 6/2004 | Eurlings et al. |
| 2004/0130775 A1 | 7/2004 | Grebinski |
| 2004/0160582 A1 | 8/2004 | Lof et al. |
| 2004/0207386 A1 | 10/2004 | Durr |
| 2005/0024612 A1 | 2/2005 | Hirukawa et al. |
| 2005/0094122 A1 | 5/2005 | Hagiwara et al. |
| 2005/0095749 A1 | 5/2005 | Krellman et al. |
| 2005/0141583 A1 | 6/2005 | Sandstrom |
| 2005/0146702 A1 | 7/2005 | Eurlings et al. |
| 2005/0168790 A1 | 8/2005 | Latypov et al. |
| 2005/0213068 A1 | 9/2005 | Ishii et al. |
| 2005/0231703 A1 | 10/2005 | Kobayashi |
| 2005/0270515 A1 | 12/2005 | Troost et al. |
| 2005/0281516 A1 | 12/2005 | Okazaki et al. |
| 2006/0012770 A1 | 1/2006 | Dierichs |
| 2006/0050261 A1 | 3/2006 | Brotsack |
| 2006/0055834 A1 | 3/2006 | Tanitsu et al. |
| 2006/0114446 A1 | 6/2006 | Gui |
| 2006/0138349 A1 | 6/2006 | Bleeker et al. |
| 2006/0170901 A1 | 8/2006 | Tanitsu et al. |
| 2006/0175556 A1 | 8/2006 | Yabuki |
| 2006/0176452 A1 | 8/2006 | Kim et al. |
| 2006/0203214 A1 | 9/2006 | Shiraishi |
| 2006/0232841 A1 | 10/2006 | Toishi et al. |
| 2006/0245033 A1 | 11/2006 | Baba-Ali et al. |
| 2007/0013888 A1 | 1/2007 | Flagello et al. |
| 2007/0146676 A1 | 6/2007 | Tanitsu et al. |
| 2007/0165202 A1 | 7/2007 | Koehler et al. |
| 2007/0201338 A1 | 8/2007 | Yaoita et al. |
| 2007/0273852 A1 | 11/2007 | Arai |
| 2007/0273853 A1 | 11/2007 | Bleeker et al. |
| 2008/0021948 A1 | 1/2008 | Wilson et al. |
| 2008/0030707 A1 | 2/2008 | Tanaka et al. |
| 2008/0074631 A1 | 3/2008 | Kita |
| 2008/0079930 A1 | 4/2008 | Klarenbeek |
| 2008/0095531 A1 | 4/2008 | Yeo et al. |
| 2008/0239268 A1 | 10/2008 | Mulder et al. |
| 2008/0259304 A1 | 10/2008 | Dierichs |
| 2009/0021656 A1 | 1/2009 | Ozaki |
| 2009/0033902 A1 | 2/2009 | Mulder et al. |
| 2009/0073411 A1 | 3/2009 | Tanitsu |
| 2009/0091730 A1 | 4/2009 | Tanaka |
| 2009/0097007 A1 | 4/2009 | Tanaka |
| 2009/0097094 A1 | 4/2009 | Tanaka |
| 2009/0109417 A1 | 4/2009 | Tanitsu |
| 2009/0128886 A1 | 5/2009 | Hirota |
| 2009/0147247 A1 | 6/2009 | Endo et al. |
| 2009/0174877 A1 | 7/2009 | Mulder et al. |
| 2009/0263736 A1 | 10/2009 | Inoue et al. |
| 2010/0195077 A1 | 8/2010 | Koehler et al. |
| 2012/0202157 A1 | 8/2012 | Tanitsu |
| 2012/0236284 A1 | 9/2012 | Tanaka |

FOREIGN PATENT DOCUMENTS

| | | |
|---|---|---|
| CN | 200410011836.8 | 3/2005 |
| CN | 200480033300.4 | 12/2006 |
| DE | 206 607 | 2/1984 |
| DE | 221 563 A1 | 4/1985 |
| DE | 224 448 A1 | 7/1985 |
| DE | 242 880 A1 | 2/1987 |
| DE | 196 35 792 A1 | 4/1997 |
| DE | 100 29 938 A1 | 7/2001 |
| DE | 103 43 333 A1 | 4/2005 |
| EP | 0 023 231 A1 | 2/1981 |
| EP | 0 208 552 A2 | 1/1987 |
| EP | 0 656 555 A1 | 6/1995 |
| EP | 0 764 858 A2 | 3/1997 |
| EP | 0 779 530 | 6/1997 |
| EP | 1 109 067 A2 | 6/2001 |
| EP | 1 211 561 A2 | 6/2002 |
| EP | 1 280 007 A2 | 1/2003 |
| EP | 1 395 049 A1 | 3/2004 |
| EP | 1 489 462 A2 | 12/2004 |
| EP | 1 882 895 A1 | 5/2005 |
| EP | 1 674 935 A2 | 6/2006 |
| EP | 1 798 758 A1 | 6/2007 |
| EP | 1 993 120 A1 | 11/2008 |
| FR | 2 474 708 | 7/1981 |
| JP | A-44-4993 | 2/1969 |
| JP | A-56-6666 | 1/1981 |
| JP | A-57-117238 | 7/1982 |
| JP | A-57-152129 | 9/1982 |
| JP | A-57-153433 | 9/1982 |
| JP | A-58-49932 | 3/1983 |
| JP | U-58-45502 | 3/1983 |
| JP | A-58-115945 | 7/1983 |
| JP | A-58-202448 | 11/1983 |
| JP | A-59-19912 | 2/1984 |
| JP | A-59-155843 | 9/1984 |
| JP | A-59-226317 | 12/1984 |
| JP | A-61-44429 | 3/1986 |
| JP | A-61-45923 | 3/1986 |
| JP | A-61-91662 | 5/1986 |
| JP | U-61-94342 | 6/1986 |
| JP | A-61-156736 | 7/1986 |
| JP | A-61-196532 | 8/1986 |
| JP | A-61-217434 | 9/1986 |

| | | | | | | |
|---|---|---|---|---|---|---|
| JP | A-61-251025 | 11/1986 | | JP | A-4-225357 | 8/1992 |
| JP | A-61-270049 | 11/1986 | | JP | A-4-235558 | 8/1992 |
| JP | A-62-2539 | 1/1987 | | JP | A-4-265805 | 9/1992 |
| JP | A-62-2540 | 1/1987 | | JP | A-4-273245 | 9/1992 |
| JP | A-62-17705 | 1/1987 | | JP | A-4-273427 | 9/1992 |
| JP | A-62-65326 | 3/1987 | | JP | A-4-280619 | 10/1992 |
| JP | A-62-100161 | 5/1987 | | JP | A-4-282539 | 10/1992 |
| JP | A-62-120026 | 6/1987 | | JP | A-4-296092 | 10/1992 |
| JP | A-62-121417 | 6/1987 | | JP | A-4-297030 | 10/1992 |
| JP | A-62-122215 | 6/1987 | | JP | A-4-305915 | 10/1992 |
| JP | A-62-153710 | 7/1987 | | JP | A-4-305917 | 10/1992 |
| JP | A-62-183522 | 8/1987 | | JP | U-4-117212 | 10/1992 |
| JP | A-62-188316 | 8/1987 | | JP | A-4-330961 | 11/1992 |
| JP | A-62-203526 | 9/1987 | | JP | A-4-343307 | 11/1992 |
| JP | A-63-12134 | 1/1988 | | JP | A-4-350925 | 12/1992 |
| JP | A-63-36526 | 2/1988 | | JP | A-05-013292 | 1/1993 |
| JP | A-63-73628 | 4/1988 | | JP | A-5-21314 | 1/1993 |
| JP | A-63-128713 | 6/1988 | | JP | A-5-45886 | 2/1993 |
| JP | A-63-131008 | 6/1988 | | JP | A-5-62877 | 3/1993 |
| JP | A-63-141313 | 6/1988 | | JP | A-5-90128 | 4/1993 |
| JP | A-63-157419 | 6/1988 | | JP | A-5-109601 | 4/1993 |
| JP | A-63-160192 | 7/1988 | | JP | A-5-127086 | 5/1993 |
| JP | A-63-231217 | 9/1988 | | JP | A-5-129184 | 5/1993 |
| JP | A-63-275912 | 11/1988 | | JP | A-5-134230 | 5/1993 |
| JP | A-63-292005 | 11/1988 | | JP | A-5-160002 | 6/1993 |
| JP | A-64-18002 | 1/1989 | | JP | A-5-175098 | 7/1993 |
| JP | A-64-26704 | 2/1989 | | JP | A-5-199680 | 8/1993 |
| JP | A-64-68926 | 3/1989 | | JP | A-5-217837 | 8/1993 |
| JP | A-1-91419 | 4/1989 | | JP | A-5-217840 | 8/1993 |
| JP | A-1-115033 | 5/1989 | | JP | A-5-241324 | 9/1993 |
| JP | A-1-147516 | 6/1989 | | JP | A-5-243364 | 9/1993 |
| JP | A-1-202833 | 8/1989 | | JP | A-5-259069 | 10/1993 |
| JP | A-1-214042 | 8/1989 | | JP | A-5-283317 | 10/1993 |
| JP | U-1-127379 | 8/1989 | | JP | A-5-304072 | 11/1993 |
| JP | A-1-255404 | 10/1989 | | JP | A-5-319774 | 12/1993 |
| JP | A-1-258550 | 10/1989 | | JP | A-5-323583 | 12/1993 |
| JP | A-1-276043 | 11/1989 | | JP | A-5-326370 | 12/1993 |
| JP | A-1-278240 | 11/1989 | | JP | A-6-29204 | 2/1994 |
| JP | A-1-286478 | 11/1989 | | JP | A-6-42918 | 2/1994 |
| JP | A-1-292343 | 11/1989 | | JP | A-6-53120 | 2/1994 |
| JP | A-1-314247 | 12/1989 | | JP | A-6-29102 | 4/1994 |
| JP | A-1-319964 | 12/1989 | | JP | A-6-97269 | 4/1994 |
| JP | A-2-42382 | 2/1990 | | JP | A-6-104167 | 4/1994 |
| JP | A-2-65149 | 3/1990 | | JP | A-6-120110 | 4/1994 |
| JP | A-2-65222 | 3/1990 | | JP | A-6-36054 | 5/1994 |
| JP | A-2-97239 | 4/1990 | | JP | A-6-124126 | 5/1994 |
| JP | A-2-106917 | 4/1990 | | JP | A-6-124872 | 5/1994 |
| JP | A-2-116115 | 4/1990 | | JP | A-06-124873 | 5/1994 |
| JP | A-2-139146 | 5/1990 | | JP | A-6-124873 | 5/1994 |
| JP | A-2-166717 | 6/1990 | | JP | A-6-140306 | 5/1994 |
| JP | A-2-261073 | 10/1990 | | JP | A-6-148399 | 5/1994 |
| JP | A-2-264901 | 10/1990 | | JP | A-6-163350 | 6/1994 |
| JP | A-2-285320 | 11/1990 | | JP | A-6-168866 | 6/1994 |
| JP | A-2-287308 | 11/1990 | | JP | A-6-177007 | 6/1994 |
| JP | A-2-298431 | 12/1990 | | JP | A-6-181157 | 6/1994 |
| JP | A-2-311237 | 12/1990 | | JP | A-6-186025 | 7/1994 |
| JP | A-3-41399 | 2/1991 | | JP | A-6-188169 | 7/1994 |
| JP | A-3-64811 | 3/1991 | | JP | A-6-196388 | 7/1994 |
| JP | A-3-72298 | 3/1991 | | JP | A-6-204113 | 7/1994 |
| JP | A-3-94445 | 4/1991 | | JP | A-6-204121 | 7/1994 |
| JP | A-3-132663 | 6/1991 | | JP | A-6-229741 | 8/1994 |
| JP | A-3-134341 | 6/1991 | | JP | A-6-241720 | 9/1994 |
| JP | A-3-167419 | 7/1991 | | JP | A-6-244082 | 9/1994 |
| JP | A-3-168640 | 7/1991 | | JP | A-6-267825 | 9/1994 |
| JP | A-3-211812 | 9/1991 | | JP | A-6-283403 | 10/1994 |
| JP | A-3-263810 | 11/1991 | | JP | A-06-291023 | 10/1994 |
| JP | A-4-11613 | 1/1992 | | JP | A-6-310399 | 11/1994 |
| JP | A-4-32154 | 2/1992 | | JP | A-6-325894 | 11/1994 |
| JP | A-4-065603 | 3/1992 | | JP | A-6-326174 | 11/1994 |
| JP | A-4-96315 | 3/1992 | | JP | A-6-349701 | 12/1994 |
| JP | A-4-101148 | 4/1992 | | JP | A-7-69621 | 3/1995 |
| JP | A-4-130710 | 5/1992 | | JP | A-7-92424 | 4/1995 |
| JP | A-4-132909 | 5/1992 | | JP | A-7-122469 | 5/1995 |
| JP | A-4-133414 | 5/1992 | | JP | A-7-132262 | 5/1995 |
| JP | A-4-152512 | 5/1992 | | JP | A-7-134955 | 5/1995 |
| JP | A-4-179115 | 6/1992 | | JP | A-7-135158 | 5/1995 |
| JP | A-4-186244 | 7/1992 | | JP | A-7-135165 | 5/1995 |
| JP | U-4-80052 | 7/1992 | | JP | A-7-147223 | 6/1995 |
| JP | A-4-211110 | 8/1992 | | JP | A-7-167998 | 7/1995 |

| | | | | | |
|---|---|---|---|---|---|
| JP | A-7-168286 | 7/1995 | JP | A-10-38812 | 2/1998 |
| JP | A-7-174974 | 7/1995 | JP | A-10-55713 | 2/1998 |
| JP | A-7-176468 | 7/1995 | JP | A-10-62305 | 3/1998 |
| JP | A-7-183201 | 7/1995 | JP | A-10-64790 | 3/1998 |
| JP | A-7-183214 | 7/1995 | JP | A-10-79337 | 3/1998 |
| JP | A-7-190741 | 7/1995 | JP | A-10-82611 | 3/1998 |
| JP | A-7-201723 | 8/1995 | JP | A-10-92735 | 4/1998 |
| JP | A-7-220989 | 8/1995 | JP | A-10-97969 | 4/1998 |
| JP | A-7-220990 | 8/1995 | JP | A-10-104427 | 4/1998 |
| JP | A-7-220995 | 8/1995 | JP | A-10-116760 | 5/1998 |
| JP | A-7-221010 | 8/1995 | JP | A-10-116778 | 5/1998 |
| JP | A-7-239212 | 9/1995 | JP | A-10-135099 | 5/1998 |
| JP | A-7-243814 | 9/1995 | JP | A-H10-116779 | 5/1998 |
| JP | A-7-245258 | 9/1995 | JP | A-H10-125572 | 5/1998 |
| JP | A-7-263315 | 10/1995 | JP | A-H10-134028 | 5/1998 |
| JP | A-7-283119 | 10/1995 | JP | A-10-163099 | 6/1998 |
| JP | A-7-297272 | 11/1995 | JP | A-10-163302 | 6/1998 |
| JP | A-7-307268 | 11/1995 | JP | A-10-169249 | 6/1998 |
| JP | A-7-318847 | 12/1995 | JP | A-10-189427 | 7/1998 |
| JP | A-7-335748 | 12/1995 | JP | A-10-189700 | 7/1998 |
| JP | A-8-10971 | 1/1996 | JP | A-10-206714 | 8/1998 |
| JP | A-8-17709 | 1/1996 | JP | A-10-208993 | 8/1998 |
| JP | A-8-22948 | 1/1996 | JP | A-10-209018 | 8/1998 |
| JP | A-8-37149 | 2/1996 | JP | A-10-214783 | 8/1998 |
| JP | A-8-37227 | 2/1996 | JP | A-10-228661 | 8/1998 |
| JP | A-8-46751 | 2/1996 | JP | A-10-255319 | 9/1998 |
| JP | A-8-63231 | 3/1996 | JP | A-10-294268 | 11/1998 |
| JP | A-8-115868 | 5/1996 | JP | A-10-303114 | 11/1998 |
| JP | A-8-136475 | 5/1996 | JP | A-10-340846 | 12/1998 |
| JP | A-8-151220 | 6/1996 | JP | A-11-003849 | 1/1999 |
| JP | A-8-162397 | 6/1996 | JP | A-11-3849 | 1/1999 |
| JP | A-8-166475 | 6/1996 | JP | A-11-3856 | 1/1999 |
| JP | A-8-171054 | 7/1996 | JP | A-11-8194 | 1/1999 |
| JP | A-8-195375 | 7/1996 | JP | A-11-14876 | 1/1999 |
| JP | A-8-203803 | 8/1996 | JP | A-11-16816 | 1/1999 |
| JP | A-8-279549 | 10/1996 | JP | A-11-40657 | 2/1999 |
| JP | A-8-288213 | 11/1996 | JP | A-11-54426 | 2/1999 |
| JP | A-8-297699 | 11/1996 | JP | A-11-74185 | 3/1999 |
| JP | A-08-313842 | 11/1996 | JP | A-11-87237 | 3/1999 |
| JP | A-8-316125 | 11/1996 | JP | A-11-111601 | 4/1999 |
| JP | A-8-316133 | 11/1996 | JP | A-11-111818 | 4/1999 |
| JP | A-8-330224 | 12/1996 | JP | A-11-111819 | 4/1999 |
| JP | A-8-334695 | 12/1996 | JP | A-11-121328 | 4/1999 |
| JP | A-8-335552 | 12/1996 | JP | A-11-135400 | 5/1999 |
| JP | A-9-7933 | 1/1997 | JP | A-11-142556 | 5/1999 |
| JP | A-9-15834 | 1/1997 | JP | A-11-150062 | 6/1999 |
| JP | A-9-22121 | 1/1997 | JP | A-11-159571 | 6/1999 |
| JP | A-9-61686 | 3/1997 | JP | A-11-162831 | 6/1999 |
| JP | A-9-82626 | 3/1997 | JP | A-11-163103 | 6/1999 |
| JP | A-9-83877 | 3/1997 | JP | A-11-164543 | 6/1999 |
| JP | A-9-108551 | 4/1997 | JP | A-11-166990 | 6/1999 |
| JP | A-92593 | 4/1997 | JP | A-11-98 | 7/1999 |
| JP | A-9-115794 | 5/1997 | JP | A-11-176727 | 7/1999 |
| JP | A-9-134870 | 5/1997 | JP | A-11-176744 | 7/1999 |
| JP | A-9-148406 | 6/1997 | JP | A-11-195602 | 7/1999 |
| JP | A-9-151658 | 6/1997 | JP | A-11-204390 | 7/1999 |
| JP | A-9-160004 | 6/1997 | JP | A-11-218466 | 8/1999 |
| JP | A-9-160219 | 6/1997 | JP | A-11-219882 | 8/1999 |
| JP | A-9-162106 | 6/1997 | JP | A-11-233434 | 8/1999 |
| JP | A-9-178415 | 7/1997 | JP | A-11-238680 | 8/1999 |
| JP | A-9-184787 | 7/1997 | JP | A-11-239758 | 9/1999 |
| JP | A-9-184918 | 7/1997 | JP | A-11-260686 | 9/1999 |
| JP | A-9-186082 | 7/1997 | JP | A-11-260791 | 9/1999 |
| JP | A-9-190969 | 7/1997 | JP | A-11-264756 | 9/1999 |
| JP | A-9-213129 | 8/1997 | JP | A-11-283903 | 10/1999 |
| JP | A-9-219358 | 8/1997 | JP | A-11-288879 | 10/1999 |
| JP | A-9-215208 | 9/1997 | JP | A-11-307610 | 11/1999 |
| JP | A-9-227294 | 9/1997 | JP | A-11-312631 | 11/1999 |
| JP | A-9-232213 | 9/1997 | JP | A-11-354624 | 12/1999 |
| JP | A-9-243892 | 9/1997 | JP | A-2000-3874 | 1/2000 |
| JP | A-9-246672 | 9/1997 | JP | A-2000-12453 | 1/2000 |
| JP | A-9-281077 | 10/1997 | JP | A-2000-21742 | 1/2000 |
| JP | A-9-325255 | 12/1997 | JP | A-2000-21748 | 1/2000 |
| JP | A-9-326338 | 12/1997 | JP | A-2000-29202 | 1/2000 |
| JP | A-10-002865 | 1/1998 | JP | A-2000-32403 | 1/2000 |
| JP | A-10-3039 | 1/1998 | JP | A-2000-36449 | 2/2000 |
| JP | A-10-20195 | 1/1998 | JP | A-2000-58436 | 2/2000 |
| JP | A-10-32160 | 2/1998 | JP | A-2000-81320 | 3/2000 |
| JP | A-10-38517 | 2/1998 | JP | A-2000-92815 | 3/2000 |

| | | | | | | |
|---|---|---|---|---|---|---|
| JP | A-2000-97616 | 4/2000 | | JP | A-2002-263553 | 9/2002 |
| JP | A-2000-106340 | 4/2000 | | JP | A-2002-277742 | 9/2002 |
| JP | A-2000-114157 | 4/2000 | | JP | A-2002-289505 | 10/2002 |
| JP | A-2000-121491 | 4/2000 | | JP | A-2002-305140 | 10/2002 |
| JP | A-2000-121498 | 4/2000 | | JP | A-2002-323658 | 11/2002 |
| JP | A-2000-147346 | 5/2000 | | JP | A-2002-324743 | 11/2002 |
| JP | A-2000-154251 | 6/2000 | | JP | A-2002-329651 | 11/2002 |
| JP | A-2000-180371 | 6/2000 | | JP | A-2002-334836 | 11/2002 |
| JP | A-2000-206279 | 7/2000 | | JP | A2002-353105 | 12/2002 |
| JP | A-2000-208407 | 7/2000 | | JP | A-2002-357715 | 12/2002 |
| JP | A-2000-240717 | 9/2000 | | JP | A-2002-359174 | 12/2002 |
| JP | A-2000-243684 | 9/2000 | | JP | A-2002-362737 | 12/2002 |
| JP | A-2000-252201 | 9/2000 | | JP | A-2002-365783 | 12/2002 |
| JP | A-2000-283889 | 10/2000 | | JP | A-2002-367523 | 12/2002 |
| JP | A-2000-286176 | 10/2000 | | JP | A-2002-367886 | 12/2002 |
| JP | A-2000-311853 | 11/2000 | | JP | A-2002-373849 | 12/2002 |
| JP | A-2000-323403 | 11/2000 | | JP | A-2003-15040 | 1/2003 |
| JP | A-2001-7015 | 1/2001 | | JP | A-2003-17003 | 1/2003 |
| JP | A-2001-20951 | 1/2001 | | JP | A-2003-17404 | 1/2003 |
| JP | A-2001-37201 | 1/2001 | | JP | A-2003-28673 | 1/2003 |
| JP | A-2001-44097 | 2/2001 | | JP | A-2003-35822 | 2/2003 |
| JP | A-2001-74240 | 3/2001 | | JP | A-2003-43223 | 2/2003 |
| JP | A-2001-83472 | 3/2001 | | JP | A-2003-45219 | 2/2003 |
| JP | A-2001-85307 | 3/2001 | | JP | A-2003-45712 | 2/2003 |
| JP | A-2001-97734 | 4/2001 | | JP | A-2003-59286 | 2/2003 |
| JP | A-2001-110707 | 4/2001 | | JP | A-2003-59803 | 2/2003 |
| JP | A-2001-118773 | 4/2001 | | JP | A-2003-59821 | 2/2003 |
| JP | A-2001-135560 | 5/2001 | | JP | A-2003-68600 | 3/2003 |
| JP | A-2001-144004 | 5/2001 | | JP | A-2003-75703 | 3/2003 |
| JP | A-2001-167996 | 6/2001 | | JP | A-2003-81654 | 3/2003 |
| JP | A-2001-176766 | 6/2001 | | JP | A-2003-84445 | 3/2003 |
| JP | A-2001-203140 | 7/2001 | | JP | A-2003-98651 | 4/2003 |
| JP | A-2001-218497 | 8/2001 | | JP | A-2003-100597 | 4/2003 |
| JP | A-2001-228401 | 8/2001 | | JP | A-2003-114387 | 4/2003 |
| JP | A-2001-228404 | 8/2001 | | JP | A-2003-124095 | 4/2003 |
| JP | A-2001-230323 | 8/2001 | | JP | A-2003-130132 | 5/2003 |
| JP | A-2001-242269 | 9/2001 | | JP | A-2003-149363 | 5/2003 |
| JP | A-2001-265581 | 9/2001 | | JP | A-2003-151880 | 5/2003 |
| JP | A-2001-267227 | 9/2001 | | JP | A-2003-161882 | 6/2003 |
| JP | A-2001-272764 | 10/2001 | | JP | A-2003-163158 | 6/2003 |
| JP | A-2001-274083 | 10/2001 | | JP | A-2003-166856 | 6/2003 |
| JP | A-2001-282526 | 10/2001 | | JP | A2003-173957 | 6/2003 |
| JP | A-2001-296105 | 10/2001 | | JP | A-2003-188087 | 7/2003 |
| JP | A-2001-297976 | 10/2001 | | JP | A-2003-195223 | 7/2003 |
| JP | A-2001-304332 | 10/2001 | | JP | A-2003-224961 | 8/2003 |
| JP | A-2001-307982 | 11/2001 | | JP | A-2003-229347 | 8/2003 |
| JP | A-2001-307983 | 11/2001 | | JP | A-2003-233001 | 8/2003 |
| JP | A-2001-313250 | 11/2001 | | JP | A-2003-238577 | 8/2003 |
| JP | A-2001-338868 | 12/2001 | | JP | A-2003-240906 | 8/2003 |
| JP | A-2001-345262 | 12/2001 | | JP | A-2003-249443 | 9/2003 |
| JP | A-2002-14005 | 1/2002 | | JP | A-2003-258071 | 9/2003 |
| JP | A-2002-15978 | 1/2002 | | JP | A-2003-262501 | 9/2003 |
| JP | A-2002-16124 | 1/2002 | | JP | A-2003-263119 | 9/2003 |
| JP | A-2002-43213 | 2/2002 | | JP | A-2003-272837 | 9/2003 |
| JP | A-2002-57097 | 2/2002 | | JP | A-2003-273338 | 9/2003 |
| JP | A-2002-66428 | 3/2002 | | JP | A-2003-279889 | 10/2003 |
| JP | A-2002-71513 | 3/2002 | | JP | A-2003-282423 | 10/2003 |
| JP | A-2002-75816 | 3/2002 | | JP | A-2003-297727 | 10/2003 |
| JP | A-2002-91922 | 3/2002 | | JP | A-2003-532281 | 10/2003 |
| JP | A-2002-93686 | 3/2002 | | JP | A-2003-532282 | 10/2003 |
| JP | A-2002-93690 | 3/2002 | | JP | A-2003-311923 | 11/2003 |
| JP | A-2002-100561 | 4/2002 | | JP | A-2004-006440 | 1/2004 |
| JP | A-2002-118058 | 4/2002 | | JP | A-2004-7417 | 1/2004 |
| JP | A-2002-141270 | 5/2002 | | JP | A-2004-14642 | 1/2004 |
| JP | A-2002-158157 | 5/2002 | | JP | A-2004-14876 | 1/2004 |
| JP | A-2002-170495 | 6/2002 | | JP | A-2004-15187 | 1/2004 |
| JP | A-2002-353105 | 6/2002 | | JP | A-2004-22708 | 1/2004 |
| JP | A-2002-190438 | 7/2002 | | JP | A-2004-38247 | 2/2004 |
| JP | A-2002-195912 | 7/2002 | | JP | A-2004-39952 | 2/2004 |
| JP | A-2002-198284 | 7/2002 | | JP | A-2004-40039 | 2/2004 |
| JP | A-2002-202221 | 7/2002 | | JP | A-2004-45063 | 2/2004 |
| JP | A-2002-203763 | 7/2002 | | JP | A-2004-63847 | 2/2004 |
| JP | A-2002-208562 | 7/2002 | | JP | A-2004-71851 | 3/2004 |
| JP | A-2002-520810 | 7/2002 | | JP | A-2004-85612 | 3/2004 |
| JP | A-2002-222754 | 8/2002 | | JP | A-2004-87987 | 3/2004 |
| JP | A-2002-227924 | 8/2002 | | JP | A-2004-95653 | 3/2004 |
| JP | A-2002-231619 | 8/2002 | | JP | U-3102327 | 3/2004 |
| JP | A-2002-258487 | 9/2002 | | JP | A-2001-23996 | 4/2004 |
| JP | A-2002-261004 | 9/2002 | | JP | A-2004-98012 | 4/2004 |

| | | | | | | |
|---|---|---|---|---|---|---|
| JP | A-2004-101362 | 4/2004 | | JP | A-2005-93948 | 4/2005 |
| JP | A-2004-103674 | 4/2004 | | JP | A-2005-97057 | 4/2005 |
| JP | A-2004-111569 | 4/2004 | | JP | A-2005-108934 | 4/2005 |
| JP | A-2004-111579 | 4/2004 | | JP | A-2005-114882 | 4/2005 |
| JP | A-2004-119497 | 4/2004 | | JP | A-2005-116570 | 4/2005 |
| JP | A-2004-119717 | 4/2004 | | JP | A-2005-116571 | 4/2005 |
| JP | A-2004-128307 | 4/2004 | | JP | A-2005-116831 | 4/2005 |
| JP | A-2004-134682 | 4/2004 | | JP | A-2005-123586 | 5/2005 |
| JP | A-2004-093624 | 5/2004 | | JP | A-2005-127460 | 5/2005 |
| JP | A-2004-140145 | 5/2004 | | JP | A-2005-136404 | 5/2005 |
| JP | A-2004-145269 | 5/2004 | | JP | A-2005-136422 | 5/2005 |
| JP | A-2004-146702 | 5/2004 | | JP | A-2005-140999 | 6/2005 |
| JP | A-2004-152705 | 5/2004 | | JP | A-2005-150759 | 6/2005 |
| JP | A-2004-153064 | 5/2004 | | JP | A-2005-156592 | 6/2005 |
| JP | A-2004-153096 | 5/2004 | | JP | A-2005-166871 | 6/2005 |
| JP | A-2004-163555 | 6/2004 | | JP | A-2005-175176 | 6/2005 |
| JP | A-2004-165249 | 6/2004 | | JP | A-2005-175177 | 6/2005 |
| JP | A-2004-165416 | 6/2004 | | JP | A-2005-191344 | 7/2005 |
| JP | A-2004-172471 | 6/2004 | | JP | A-2005-203483 | 7/2005 |
| JP | A-2004-177468 | 6/2004 | | JP | A-2005-209705 | 8/2005 |
| JP | A-2004-179172 | 6/2004 | | JP | A-2005-209706 | 8/2005 |
| JP | A-2004-187401 | 7/2004 | | JP | A-2005-223328 | 8/2005 |
| JP | A-2004-193252 | 7/2004 | | JP | A-2005-233979 | 9/2005 |
| JP | A-2004-193425 | 7/2004 | | JP | A-2005-234359 | 9/2005 |
| JP | A-2004-198748 | 7/2004 | | JP | A-2005-236088 | 9/2005 |
| JP | A-2004-205698 | 7/2004 | | JP | A-2005-243770 | 9/2005 |
| JP | A-2004-207696 | 7/2004 | | JP | A-2005-243870 | 9/2005 |
| JP | A-2004-207711 | 7/2004 | | JP | A-2005-243904 | 9/2005 |
| JP | A-2004-260115 | 7/2004 | | JP | A-2005-251549 | 9/2005 |
| JP | A-2004-221253 | 8/2004 | | JP | A-2005-257740 | 9/2005 |
| JP | A-2004-224421 | 8/2004 | | JP | A-2005-259789 | 9/2005 |
| JP | A-2004-228497 | 8/2004 | | JP | A-2005-259830 | 9/2005 |
| JP | A-2004-233897 | 8/2004 | | JP | A-2005-268700 | 9/2005 |
| JP | A-2004-241666 | 8/2004 | | JP | A-2005-268741 | 9/2005 |
| JP | A-2004-247527 | 9/2004 | | JP | A-2005-268742 | 9/2005 |
| JP | A-2004-259828 | 9/2004 | | JP | A-2005-276932 | 10/2005 |
| JP | A-2004-259966 | 9/2004 | | JP | A-2005-302825 | 10/2005 |
| JP | A-2004-259985 | 9/2004 | | JP | A-2005-303167 | 10/2005 |
| JP | A-2004-260043 | 9/2004 | | JP | A-2005-311020 | 11/2005 |
| JP | A-2004-260081 | 9/2004 | | JP | A-2005-315918 | 11/2005 |
| JP | A-2004-294202 | 10/2004 | | JP | A-2005-340605 | 12/2005 |
| JP | A-2004-301825 | 10/2004 | | JP | A-2005-366813 | 12/2005 |
| JP | A-2004-302043 | 10/2004 | | JP | A-2005-537658 | 12/2005 |
| JP | A-2004-303808 | 10/2004 | | JP | A-2006-1821 | 1/2006 |
| JP | A-2004-304135 | 10/2004 | | JP | A-2006-5197 | 1/2006 |
| JP | A-2004-307264 | 11/2004 | | JP | A-2006-013518 | 1/2006 |
| JP | A-2004-307265 | 11/2004 | | JP | A-2006-17895 | 1/2006 |
| JP | A-2004-307266 | 11/2004 | | JP | A-2006-19702 | 1/2006 |
| JP | A-2004-307267 | 11/2004 | | JP | A-2006-24706 | 1/2006 |
| JP | A-2004-319724 | 11/2004 | | JP | A-2006-24819 | 1/2006 |
| JP | A-2004-320017 | 11/2004 | | JP | A-2006-32750 | 2/2006 |
| JP | A-2004-327660 | 11/2004 | | JP | A-2006-032963 | 2/2006 |
| JP | A-2004-335808 | 11/2004 | | JP | A-2006-41302 | 2/2006 |
| JP | A-2004-335864 | 11/2004 | | JP | A-2006-054328 | 2/2006 |
| JP | A-2004-336922 | 11/2004 | | JP | A-2006-54364 | 2/2006 |
| JP | A-2004-342987 | 12/2004 | | JP | A-2006-73584 | 3/2006 |
| JP | A-2004-349645 | 12/2004 | | JP | A-2006-73951 | 3/2006 |
| JP | A-2004-356410 | 12/2004 | | JP | A-2006-80281 | 3/2006 |
| JP | A-2005-5295 | 1/2005 | | JP | A-2006-86141 | 3/2006 |
| JP | A-2005-5395 | 1/2005 | | JP | A-2006-86442 | 3/2006 |
| JP | A-2005-5521 | 1/2005 | | JP | A-2006-508369 | 3/2006 |
| JP | A-2005-11990 | 1/2005 | | JP | A-2006-100363 | 4/2006 |
| JP | A-2005-12228 | 1/2005 | | JP | A-2006-100686 | 4/2006 |
| JP | A-2005-018013 | 1/2005 | | JP | A-2006-113437 | 4/2006 |
| JP | A-2005-19628 | 1/2005 | | JP | A-2006-513442 | 4/2006 |
| JP | A-2005-19864 | 1/2005 | | JP | A-2006-120985 | 5/2006 |
| JP | A-2005-26634 | 1/2005 | | JP | A-2006-128192 | 5/2006 |
| JP | A-2005-503018 | 1/2005 | | JP | A-2006-135165 | 5/2006 |
| JP | A-2005-032909 | 2/2005 | | JP | A-2006-135312 | 5/2006 |
| JP | A-2005-51147 | 2/2005 | | JP | A-2006-140366 | 6/2006 |
| JP | A-2005-55811 | 3/2005 | | JP | A-2006-170811 | 6/2006 |
| JP | A-2005-64210 | 3/2005 | | JP | A-2006-170899 | 6/2006 |
| JP | A-2005-64391 | 3/2005 | | JP | A-2006-177865 | 7/2006 |
| JP | A-2005-79222 | 3/2005 | | JP | A-2006-184414 | 7/2006 |
| JP | A-2005-79584 | 3/2005 | | JP | A-2006-194665 | 7/2006 |
| JP | A-2005-79587 | 3/2005 | | JP | A-2006-516724 | 7/2006 |
| JP | A-2005-86148 | 3/2005 | | JP | A-2006-228718 | 8/2006 |
| JP | A-2005-91023 | 4/2005 | | JP | A-2006-519494 | 8/2006 |
| JP | A-2005-93324 | 4/2005 | | JP | A-2006-250587 | 9/2006 |

| | | | | | | |
|---|---|---|---|---|---|---|
| JP | A-2006-253572 | 9/2006 | | WO | WO 03/023832 A1 | 3/2003 |
| JP | A-2006-269762 | 10/2006 | | WO | WO 03/023833 A1 | 3/2003 |
| JP | A-2006-278820 | 10/2006 | | WO | WO 03/063212 A1 | 7/2003 |
| JP | A-2006-284740 | 10/2006 | | WO | WO 03/077036 A1 | 9/2003 |
| JP | A-2006-289684 | 10/2006 | | WO | WO 03/085708 A1 | 10/2003 |
| JP | A-2006-309243 | 11/2006 | | WO | WO 2004/021529 | 3/2004 |
| JP | A-2006-344747 | 12/2006 | | WO | WO 2004/051220 A2 | 6/2004 |
| JP | A-2006-349946 | 12/2006 | | WO | WO 2004/051717 A1 | 6/2004 |
| JP | A-2006-351586 | 12/2006 | | WO | WO 2004/053596 A2 | 6/2004 |
| JP | A-2007-5830 | 1/2007 | | WO | WO 2004/053950 A1 | 6/2004 |
| JP | A-2007-019079 | 1/2007 | | WO | WO 2004/053951 A1 | 6/2004 |
| JP | A-2007-43980 | 2/2007 | | WO | WO 2004/053952 A1 | 6/2004 |
| JP | A-2007-48819 | 2/2007 | | WO | WO 2004/053953 A1 | 6/2004 |
| JP | A-2007-51300 | 3/2007 | | WO | WO 2004/053954 A1 | 6/2004 |
| JP | A-2007-505488 | 3/2007 | | WO | WO 2004/053955 A1 | 6/2004 |
| JP | A-2007-87306 | 4/2007 | | WO | WO 2004/053956 A1 | 6/2004 |
| JP | A-2007-93546 | 4/2007 | | WO | WO 2004/053957 A1 | 6/2004 |
| JP | A-2007-103153 | 4/2007 | | WO | WO 2004/053958 A1 | 6/2004 |
| JP | A-2007-113939 | 5/2007 | | WO | WO 2004/053959 A1 | 6/2004 |
| JP | A-2007-119851 | 5/2007 | | WO | WO 2004/061488 A1 | 7/2004 |
| JP | A-2007-120333 | 5/2007 | | WO | WO 2004/071070 A2 | 8/2004 |
| JP | A-2007-120334 | 5/2007 | | WO | WO 2004/077164 A1 | 9/2004 |
| JP | A-2007-142313 | 6/2007 | | WO | WO 2004/086468 A1 | 10/2004 |
| JP | A-2007-144864 | 6/2007 | | WO | WO 2004/086470 A1 | 10/2004 |
| JP | A-2007-150295 | 6/2007 | | WO | WO 2004/090956 A1 | 10/2004 |
| JP | A-2007-170938 | 7/2007 | | WO | WO 2004/091079 A1 | 10/2004 |
| JP | A-2007-187649 | 7/2007 | | WO | WO 2004/094940 A1 | 11/2004 |
| JP | A-2007-207821 | 8/2007 | | WO | WO 2004/104654 A1 | 12/2004 |
| JP | A-2007-227637 | 9/2007 | | WO | WO 2004/105106 A1 | 12/2004 |
| JP | A-2007-227918 | 9/2007 | | WO | WO 2004/105107 A1 | 12/2004 |
| JP | A-2007-235041 | 9/2007 | | WO | WO 2004/107048 A2 | 12/2004 |
| JP | A-2007-258691 | 10/2007 | | WO | WO 2004/107417 A1 | 12/2004 |
| JP | A-2007-274881 | 10/2007 | | WO | WO 2004/109780 A1 | 12/2004 |
| JP | A-2007-280623 | 10/2007 | | WO | WO 2004/114380 A1 | 12/2004 |
| JP | A-2007-295702 | 11/2007 | | WO | WO 2005/006415 A1 | 1/2005 |
| JP | A-2008-3740 | 1/2008 | | WO | WO 2005/006418 A1 | 1/2005 |
| JP | A-2008-047744 | 2/2008 | | WO | WO 2005/008754 A1 | 1/2005 |
| JP | A-2008-58580 | 3/2008 | | WO | WO 2005/022615 A1 | 3/2005 |
| JP | A-2008-64924 | 3/2008 | | WO | WO 2005/026843 A2 | 3/2005 |
| JP | A-2008-102134 | 5/2008 | | WO | WO 2005/029559 A1 | 3/2005 |
| JP | A-2008-103737 | 5/2008 | | WO | WO 2005/036619 A1 | 4/2005 |
| JP | A-2008-180492 | 8/2008 | | WO | WO 2005/036620 A1 | 4/2005 |
| JP | A-2008-258605 | 10/2008 | | WO | WO 2005-036622 A1 | 4/2005 |
| JP | A-2009-17540 | 1/2009 | | WO | WO 2005-036623 A1 | 4/2005 |
| JP | A-2009-60339 | 3/2009 | | WO | WO 2005/041276 A1 | 5/2005 |
| JP | A-2009-105396 | 5/2009 | | WO | WO 2005/048325 A1 | 5/2005 |
| JP | A-2009-111369 | 5/2009 | | WO | WO 2005/048326 A1 | 5/2005 |
| JP | A-2009-117801 | 5/2009 | | WO | WO 2005/057636 A1 | 6/2005 |
| JP | A-2009-117812 | 5/2009 | | WO | WO 2005/067013 A1 | 7/2005 |
| JP | A-2010-034486 | 2/2010 | | WO | WO 2005/071717 A1 | 8/2005 |
| WO | WO 97/11411 A1 | 3/1997 | | WO | WO 2005/076321 A1 | 8/2005 |
| WO | WO 98/24115 A1 | 6/1998 | | WO | WO 2005/076323 A1 | 8/2005 |
| WO | WO 98/59364 A1 | 12/1998 | | WO | WO 2005/081291 A1 | 9/2005 |
| WO | WO 99/23692 A1 | 5/1999 | | WO | WO 2005/081292 A1 | 9/2005 |
| WO | WO 99/27568 A1 | 6/1999 | | WO | WO 2005/104195 A1 | 11/2005 |
| WO | WO 99/31716 A1 | 6/1999 | | WO | WO 2006-006730 A1 | 1/2006 |
| WO | WO 99/34255 A1 | 7/1999 | | WO | WO 2006-016551 A1 | 2/2006 |
| WO | WO 99/49366 A1 | 9/1999 | | WO | WO 2006/019124 A1 | 2/2006 |
| WO | WO 99/49504 | 9/1999 | | WO | WO 2006/025341 A1 | 3/2006 |
| WO | WO 99/49504 A1 | 9/1999 | | WO | WO 2006/028188 A1 | 3/2006 |
| WO | WO 99/50712 A1 | 10/1999 | | WO | WO 2006/030727 A1 | 3/2006 |
| WO | WO 99/66370 A1 | 12/1999 | | WO | WO 2006/030910 A1 | 3/2006 |
| WO | WO 00/11706 A1 | 3/2000 | | WO | WO 2006/035775 A1 | 4/2006 |
| WO | WO 00/67303 | 4/2000 | | WO | WO 2006/035775 A1 | 4/2006 |
| WO | WO 00/67303 A1 | 11/2000 | | WO | WO 2006-049134 A1 | 5/2006 |
| WO | WO 01/03170 A1 | 1/2001 | | WO | WO 2006/051909 A1 | 5/2006 |
| WO | WO 01/10137 A1 | 2/2001 | | WO | WO 2006-064851 A1 | 6/2006 |
| WO | WO 01/22480 A1 | 3/2001 | | WO | WO 2006/068233 A1 | 6/2006 |
| WO | WO 01/27978 A1 | 4/2001 | | WO | WO 2006/077958 A1 | 7/2006 |
| WO | WO 01/59502 A1 | 8/2001 | | WO | WO 2006/085524 A1 | 8/2006 |
| WO | WO 01/65296 A1 | 9/2001 | | WO | WO 2006/085626 A1 | 8/2006 |
| WO | WO 02/16993 A1 | 2/2002 | | WO | WO 2006/097135 | 9/2006 |
| WO | WO 02/063664 A1 | 8/2002 | | WO | WO 2006/100889 A1 | 9/2006 |
| WO | WO 02/069049 A2 | 9/2002 | | WO | WO 2006-118108 A1 | 11/2006 |
| WO | WO 02/080185 A1 | 10/2002 | | WO | WO 2007/003563 A1 | 1/2007 |
| WO | WO 02/084720 A2 | 10/2002 | | WO | WO 2007/004567 A1 | 1/2007 |
| WO | WO 02/084850 A1 | 10/2002 | | WO | WO 2007/013888 | 2/2007 |
| WO | WO 02/101804 A1 | 12/2002 | | WO | WO 2007-018127 A1 | 2/2007 |
| WO | WO 02/103766 A1 | 12/2002 | | WO | WO 2007/055237 A1 | 5/2007 |

| | | | |
|---|---|---|---|
| WO | WO 2007/055373 A1 | 5/2007 |
| WO | WO 2007/058188 A1 | 5/2007 |
| WO | WO 2007/066692 A1 | 6/2007 |
| WO | WO 2007/066758 A1 | 6/2007 |
| WO | WO 2007/097198 A1 | 8/2007 |
| WO | WO 2007/100081 A1 | 9/2007 |
| WO | WO 2007/132862 A1 | 11/2007 |
| WO | WO 2007/141997 A1 | 12/2007 |
| WO | WO 2008/015973 A1 | 2/2008 |
| WO | WO 2008/041575 A1 | 4/2008 |
| WO | WO 2008/059748 A1 | 5/2008 |
| WO | WO 2008/061681 A2 | 5/2008 |
| WO | WO 20081061681 | 5/2008 |
| WO | WO 2006-343023 | 6/2008 |
| WO | WO 2008/065977 A1 | 6/2008 |
| WO | WO 2008/075613 A1 | 6/2008 |
| WO | WO 2008/078688 A1 | 7/2008 |
| WO | WO 2008/090975 A1 | 7/2008 |
| WO | WO 2008/131928 | 11/2008 |
| WO | WO 2008/139848 A1 | 11/2008 |
| WO | WO 2009/153925 A1 | 12/2009 |
| WO | WO 2009/157154 A1 | 12/2009 |
| WO | WO 2010/001537 A1 | 1/2010 |

OTHER PUBLICATIONS

Mar. 25, 2009 International Search Report issued in International Application No. PCT/JP2008/066803.
Jan. 16, 2009 Invitation to Pay Additional Fees Relating to the results of the Partial International Search Report issued in International Application No. PCT/JP2008/066803.
May 25, 2009 International Search Report issued in International Application No. PCT/JP2008/069704.
Mar. 6, 2009 Invitation to Pay Additional Fees Relating to the results of the Partial International Search Report issued in International Application No. PCT/JP2008/069704.
Jan. 26, 2009 International Search Report issued in International Application No. PCT/JP2008/068909.
Apr. 6, 2009 International Search Report issued in International Application No. PCT/JP2008/070253.
Mar. 2, 2009 International Search Report issued in. International Application No. PCT/JP2008/069701.
Dec. 9, 2010 European Search Report issued in European Application No. 09015719.9.
Dec. 9, 2010 European Search Report issued in European Application No. 09015716.5.
Dec. 9, 2010 Partial European Search Report issued in European Application No. 09015718.1.
Oct. 15, 2010 Office Action issued in European Application No. 08 835 135.8.
Feb. 22, 2011 Office Action issued in European Application No. 08 830 323.5.
Dec. 8, 2010 Office Action issued in European Application No. 08 841 021.2.
Jun. 25, 2010 Office Action issued in European Application No. 08 837 064.8.
Mar. 24, 2011 Office Action issued in Chinese Application No. 200880024806.7 (with translation).
Jun. 30, 2011 Office Action issued in Chinese Patent Application No. 200880021453.5 (with translation).
Feb. 20, 2012 Second Office Action issued in Chinese Patent Application No. 200880018312.8 (with translation).
May 18, 2011 Office Action issued in U.S. Appl. No. 12/208,155.
Jul. 27, 2011 Office Action issued in U.S. Appl. No. 12/208,155.
Mar. 24, 2011 Office Action issued in U.S. Appl. No. 12/191,821.
Jul. 19, 2011 Office Action issued in U.S. Appl. No. 12/191,821.
Aug. 26, 2011 Office Action issued in U.S. Appl. No. 12/245,021.
Jul. 18, 2011 Office Action issued in U.S. Appl. No. 12/250,519.
Jan. 3, 2011 Office Action issued in U.S. Patent Appl. No. 12/262,930.
May 13, 2011 Office Action issued in U.S. Appl. No. 12/952,197.
Mar. 31, 2011 Notice of Allowance issued in U.S. Appl. No. 12/252,274.
Sep. 1, 2010 Office Action issued in U.S. Appl. No. 12/252,274.
Gao et al., "Research on high-quality projecting reduction lithography system based on digital mask technique", Aug. 17, 2005, vol. 116, No. 7, pp. 303-310.
Dec. 15, 2011 Notice of Allowance issued in U.S. Appl. No. 12/245,021.
Feb. 7, 2012 Notice of Allowance issued in U.S. Appl. No. 12/191,821.
Dec. 20, 2011 Office Action issued in Chinese Application No. 200980101546.3 (with English translation).
Jul. 26, 2011 Office Action issued in Chinese Application No. 200880020867.6 (with English translation).
Jul. 12, 2011 Office Action issued in Chinese Application No. 200880018312.8 (with English translation).
Nov. 17, 2011 Office Action issued in Chinese Application No. 200880024375.4 (with English translation).
Nov. 3, 2011 Office Action issued in Chinese Application No. 200880015567.9 (with English translation).
Dec. 12, 2011 Office Action issued in European Application No. 08837064.8.
Nov. 15, 2011 Office Action issued in U.S. Appl. No. 12/252,274.
Dec. 8, 2011 Office Action issued in U.S. Appl. No. 12/256,055.
Nov. 28, 2011 Notice of Allowance issued in U.S. Appl. No. 12/952,197.
Nov. 7, 2011 Office Action issued in U.S. Appl. No. 12/250,519.
Jul. 5, 2011 Office Action issued in Chinese Patent Application No. 200880100940.0 (with English translation).
May 29, 2012 Office Action issued in U.S. Appl. No. 13/417,602.
May 23, 2012 Notice of Allowance issued in U.S. Appl. No. 12/191,821.
Jan. 23, 2013 Notice of Allowance issued in U.S. Appl. No. 12/252,283.
Jan. 23, 2013 Notice of Allowance issued in U.S. Appl. No. 12/952,197.
Jan. 15, 2013 Office Action issued in Japanese Patent Application No. P2008-259522 (with translation).
Nov. 20, 2012 Office Action issued in Japanese Patent Application No. P2008-261214 (with translation).
Nov. 20, 2012 Office Action issued in Japanese Patent Application No. P2008-261215 (with translation).
Nov. 27, 2012 Notice of Allowance issued in U.S. Appl. No. 12/252,274.
Jul. 27, 2012 Search Report issued in European Patent Application No. 12171299.6.
Jul. 26, 2012 Office Action issued in Chinese Patent Application No. 200880020867.6 (with translation).
Aug. 27, 2012 Office Action issued in U.S. Appl. No. 12/256,055.
Aug. 24, 2012 Notice of Allowance issued in U.S. Appl. No. 12/245,021.
Oct. 2, 2012 European Search Report issued in European Patent Application No. 12173803.3.
Oct. 17, 2012 European Office Action issued in European Patent Application No. 08841021.2.
Sep. 28, 2012 Notice of Allowance issued in U.S. Appl. No. 12/252,283.
Oct. 17, 2012 Office Action issued in European Patent Application No. 09015716.5.
Oct. 18, 2012 Search Report issued in European Patent Application No. 09015718.1.
Oct. 10, 2012 Office Action issued in Chinese Patent Application No. 200880015567.9 (with translation).
Sep. 21, 2012 Search Report issued in European Patent Application No. 12173801.7.
Oct. 23, 2012 Notice of Allowance issued in Japanese Patent Application No. P2008-263405 (with translation).
Feb. 22, 2012 Office Action issued in Chinese Patent Application No. 200880020867.6 (with translation).
May 9, 2012 Office Action issued in European Patent Application No. 08 830 323.5.
Jun. 20, 2012 Office Action issued in Chinese Patent Application No. 200880100940.0 (with translation).
Jul. 17, 2012 Office Action issued in U.S. Appl. No. 12/250,519.
Jun. 18, 2012 Office Action issued in Chinese Patent Application No. 200880021453.5 (with translation).

Aug. 14, 2012 Notice of Allowance issued in U.S. Appl. No. 12/252,274.
Jan. 15, 2013 Notice of Allowance issued in U.S. Appl. No. 12/191,821.
Jan. 16, 2013 Notice of Allowance issued in U.S. Appl. No. 13/417,602.
Dec. 26, 2012 Office Action issued in Chinese Patent Application No. 200980101546.3 (with translation).
Dec. 18, 2012 Office Action issued in U.S. Appl. No. 12/250,519.
May 9, 2012 Office Action issued in European Patent Application No. 08830323.5.
Mar. 12, 2013 Office Action issued in Chinese Patent Application No. 200880024806.7 (with translation).
Apr. 29, 2013 Notice of Allowance issued in U.S. Appl. No. 12/252,274.
May 10, 2013 Office Action issued in European Patent Application No. 12171299.6.
Apr. 3, 2013 Office Action issued in Chinese Patent Application No. 200880100940.0 (with translation).
May 14, 2013 Office Action issued in Japanese Patent Application No. P2010-506474 (with translation).
Jan. 31, 2013 Office Action issued in Chinese Patent Application No. 200880021453.5 (with translation).
Feb. 19, 2013 Office Action issued in Japanese Patent Application No. 2010-514429 (with translation).
Mar. 11, 2013 Office Action issued in European Patent Application No. 08 847 031.5.
Mar. 19, 2013 Office Action issued in European Patent Application No. 08 830 323.5.
Jun. 17, 2013 Office Action issued in European Patent Application No. 12173802.5.

ILLUMINATION OPTICAL SYSTEM, EXPOSURE APPARATUS, AND DEVICE MANUFACTURING METHOD

CROSS-REFERENCE TO RELATED APPLICATIONS

This is a Division of application Ser. No. 12/252,283 filed Oct. 15, 2008. The disclosure of the prior applications is hereby incorporated by reference herein in its entirety. This application claims the benefit of Japanese Patent Application No, 2007-269189, filed on Oct. 16, 2007, and U.S. Provisional Application No. 60/960,949, filed on Oct. 22, 2007.

FIELD

The present invention relates to an illumination optical system for use in an exposure apparatus that manufactures a device, such as a semiconductor device, a liquid crystal display device, an imaging device, and a thin-film magnetic head, in a photolithography process, an exposure apparatus including such an illumination optical system, and a device manufacturing method with such an exposure apparatus.

BACKGROUND

In recent years, the integration of patterns that are formed on a mask has become higher. Thus, to accurately transfer a fine pattern onto a wafer, a mask pattern must be illuminated with the optimal illuminance distribution. Accordingly, a technique that has drawn attention performs modified illumination at a pupil position of an illumination optical system for an exposure apparatus to form an annular-shaped or multi-pole-shaped (e.g., quadrupole) light intensity distribution and varies the light intensity distribution on a secondary light source, which is formed on a rear focal plane of a micro-fly's eye lens. This technique increases the focal depth and resolution of a projection optical system.

To transform light from a light source to light having annular-shaped or multipole-shaped light intensity distribution at a pupil position, for example, Japanese Laid-Out Patent Publication No. 2002-353105 discloses an exposure apparatus including a movable multi-mirror (e.g., digital micromirror device (DMD)), which includes many microscopic elements mirrors that are arranged in an array. The inclination angle and inclination direction of each of the element mirrors are varied to form a predetermined light intensity distribution at a pupil position of the illumination optical system or a position conjugated with the pupil position (secondary light source position formed at a rear focal plane of a micro-fly's eye lens). In this exposure apparatus, light entering each mirror element is reflected by a reflection surface of the mirror element, deflected by a predetermined angle in a predetermined direction, and transformed to light having a predetermined light intensity distribution at the pupil position of the illumination optical system. Exposure is performed by setting the inclination angle and inclination direction of each mirror element in the movable multi-mirror so that a secondary light source image formed on a rear focal plane of the micro-fly's eye lens has the optimal light intensity distribution that corresponds to the pattern or the like of the mask during exposure.

SUMMARY

In the above-described exposure apparatus, a laser light source is used as the light source. The cross-section of the laser light emitted from the laser light source includes variations in the light intensity. Accordingly, when using such laser light to form an annular-shaped or multi-pole shaped light intensity distribution at the pupil position of the illumination optical system, a light distribution shape (cross-section of light beam) includes light intensity variations (non-uniformity of light intensity).

It is an object of the present invention to provide an illumination optical system, an exposure apparatus including such an illumination optical system, and a device manufacturing method with such an exposure apparatus that easily forms the desired light intensity distribution in which illumination non-uniformity is not distinctive at the pupil position of the illumination optical system or a position conjugated with the pupil position even when the light from a light source includes light intensity variations (non-uniformity) in the cross-section of light.

To summarize the present invention, several aspects, advantages, and novel features of the present invention are described below. However, such advantages may not all be achieved in certain aspects of the present invention. In such a manner, the present invention may be practiced so as to achieve or optimize one advantage or a series of advantages without having to achieve the advantages suggested or proposed herein.

The structure of an embodiment of the present invention will now be discussed. However, the present invention is not limited to this embodiment.

An illumination optical system according to one embodiment of the present invention illuminates an irradiated plane with illumination light provided from a light source. The illumination optical system includes a spatial light modulator which is arranged in an optical path of the illumination optical system and forms a desired light intensity distribution at a pupil position of the illumination optical system or a position optically conjugated with the pupil position. A diffuser is arranged at an incidence side of the spatial light modulator through which the illumination light enters and diffuses the illumination light entering the spatial light modulator.

An exposure apparatus according to one embodiment of the present invention transfers a pattern of a mask onto a photosensitive substrate. The exposure apparatus includes an illumination optical system according to the present invention which illuminates the mask that is arranged on an irradiated plane.

A device manufacturing method according to one embodiment of the present invention includes exposing a pattern of a mask onto a photosensitive substrate using an exposure apparatus according to the present invention, developing the photosensitive substrate onto which the pattern has been transferred to form a mask layer shaped in correspondence with the pattern on a surface of the photosensitive substrate, and processing the surface of the photosensitive substrate through the mask layer.

The illumination optical system according to one embodiment of the present invention includes a diffuser which diffuses illumination light than enters a spatial light modulator which forms a desirable light intensity distribution at a pupil position of the illumination optical system or a position optically conjugated with the pupil position. Thus, based on the diffused illumination light, the spatial light modulator forms the desired light intensity distribution at the pupil position of the illumination optical system or a position optically conjugated with the pupil position. Accordingly, illumination non-uniformity is not distinctive at the pupil position of the illumination optical system or a position optically conjugated with the pupil position.

Further, the exposure apparatus according to one embodiment of the present invention illuminates a mask using an illumination optical system according to the present invention. Thus, the pattern of a mask can be transferred onto a photosensitive substrate with a high resolution and high throughput.

The device manufacturing method according to one embodiment of the present invention performs exposure with an exposure apparatus including an illumination optical system according to the present invention. Thus, devices can be manufactured with a high throughput.

A general architecture that implements the various features of the invention will now be described with reference to the drawings. The drawings and the associated descriptions are provided to illustrate embodiments of the invention and not to limit the scope of the invention.

BEST MODE FOR CARRYING OUT THE INVENTION

Figure 1:
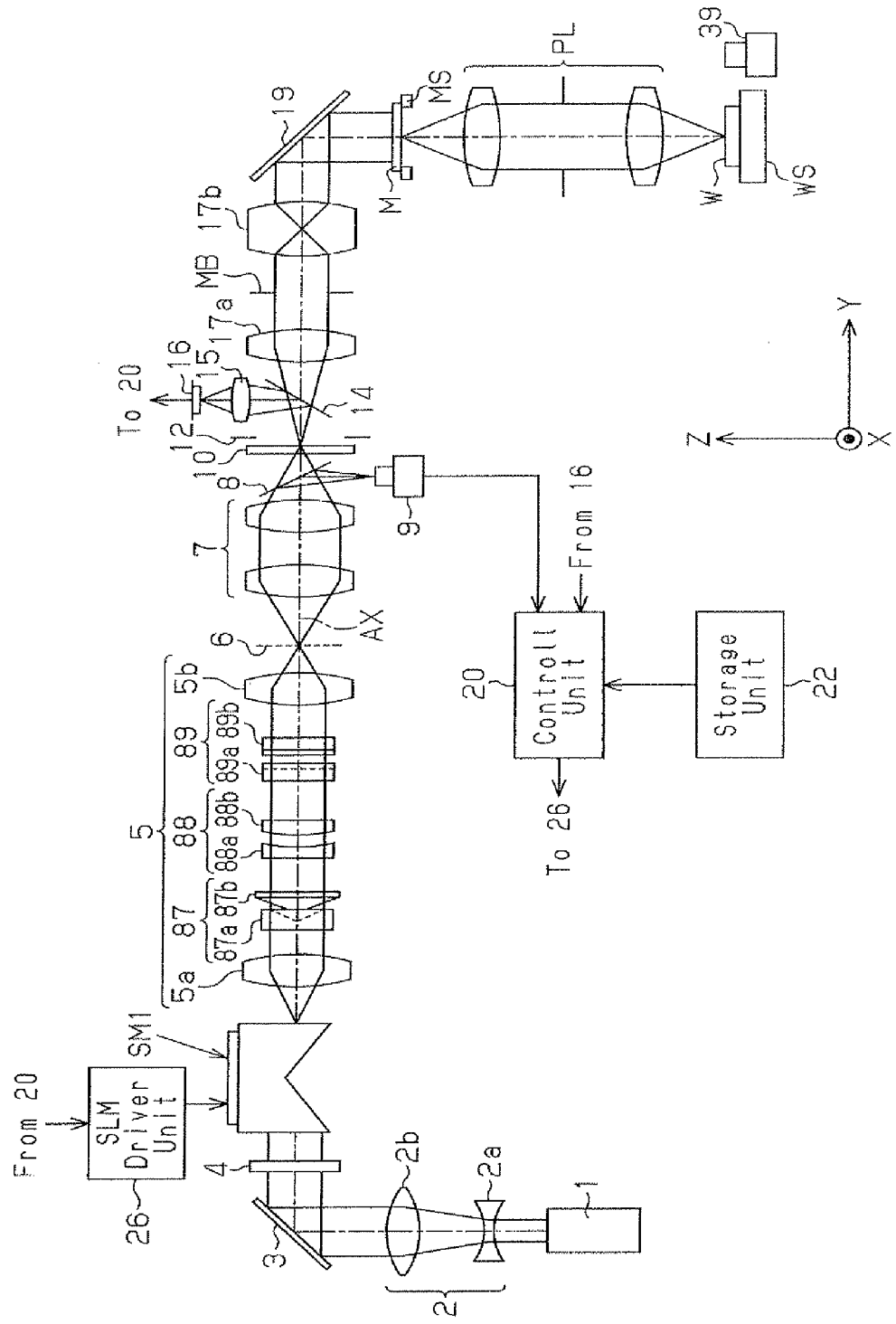
FIG. 1 is a schematic diagram showing an exposure apparatus according to an embodiment.

An exposure apparatus according to an embodiment of the present invention will now be discussed with reference to the drawings. FIG. 1 is a schematic diagram showing the structure of an exposure apparatus according to the embodiment. In the description hereafter, an XYZ orthogonal coordinate system is set as shown in FIG. 1, and the positional relationship of each member will be described with reference to the XYZ orthogonal coordinate system. The XYZ orthogonal coordinate system is set so that the X axis and the Y axis are parallel to a wafer W, and the Z axis is orthogonal to the wafer W.

With reference to FIG. 1, exposure light (illumination light) is supplied from a laser light source 1 to the exposure apparatus of the present embodiment. The laser light source 1 may be, for example, an ArF excimer laser light source, which generates light having a wavelength of 193 nm, or a KrF excimer laser light source, which generates light having a wavelength of 248 nm. The laser light source 1 emits generally parallel light in the Z direction. The light, which has a rectangular cross-section that is elongated in the X direction, enters a beam expander 2, which is formed by a pair of lenses 2a and 2b. The lenses 2a and 2b respectively have a negative refractive power and a positive refractive power in a YZ plane as viewed in FIG. 1. Accordingly, the light that enters the beam expander 2 is magnified on a YZ plane as viewed in FIG. 1 and shaped into light having a predetermined rectangular cross-section. The parallel light that has passed through the beam expander 2, which serves as a shaping optical system, is reflected by a deflection mirror 3 and deflected in the Y direction. Then, the light enters a diffuser (diffusion plate) 4. The diffuser 4 diffuses light, which is generally parallel to an optical axis AX, and emits the light angled to the optical axis AX. The light diffused by the diffuser 4 enters a spatial light modulation unit SM1.

Figure 2:
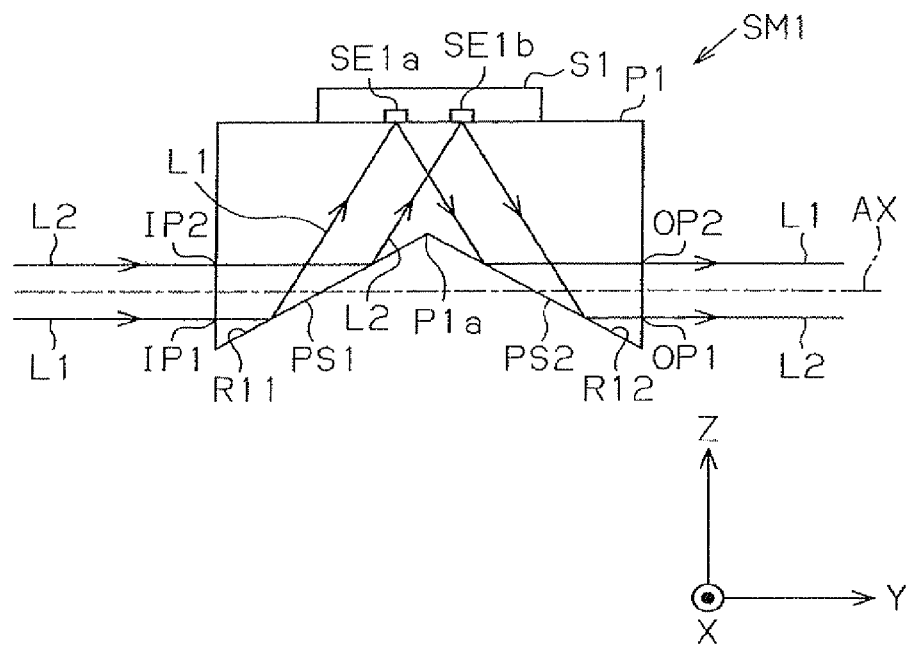
FIG. 2 is a diagram showing the structure of a spatial light modulation unit in the embodiment.

As shown in FIG. 2, the spatial light modulation unit SM1 includes a prism P1 and a spatial light converter Si, which is integrally attached to the prism P1. The prism P1, which is a rectangular parallelepiped, has a side surface in which a V-shaped, wedge-like notch is formed. That is, the prism P1 has a V-shaped notch foamed by two planes PS1 and PS2, which intersect each other at an obtuse angle. The two planes PS1 and PS2 are in contact with a straight line P1a, which extends along the X axis shown in FIG. 2. The spatial light modulator S1 is attached to the prism P1 on a side surface that is opposite the V-shaped notch. Inner sides of the two planes PS1 and PS2 function as first and second reflection surfaces R11 and R12.

The prism P1 is arranged so that the side surface to which the spatial light modulator S1 is attached is parallel to the optical axis AX and so that the first reflection surface R11 is located at the side closer to the diffuser 4 and the second reflection surface R12 is located at the side closer to an afocal lens, which will be described later. The first reflection surface R11 of the prism P1 reflects incident light in the direction of the spatial light modulator S1. The spatial light modulator Si, which is arranged in an optical path between the first reflection surface R11 and the second reflection surface R12, reflects the light reflected by the first reflection surface R11 toward the second reflection surface R12. The reflection surface R12 of the prism P1 reflects and emits the light reflected by the spatial light modulator S1 toward the afocal lens 5.

Figure 3:
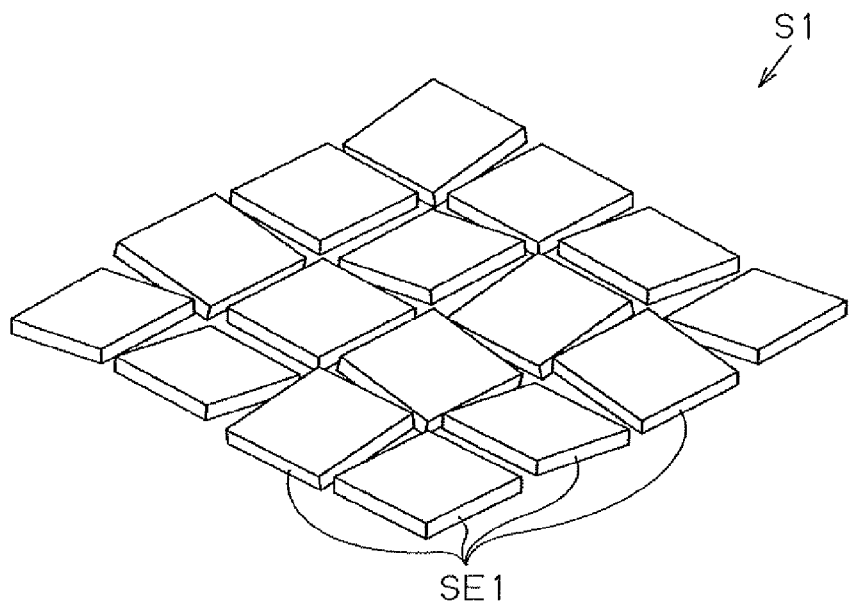
FIG. 3 is a diagram showing the structure of a spatial light modulator in the spatial light modulation unit of the embodiment.

In accordance with the position at which the light reflected by the first reflection surface R11 enters the spatial light modulator S1, the spatial light modulator S1 spatially modulates the light. As shown in FIG. 3, the spatial light modulator S1 includes a two-dimensional array of a plurality of microscopic mirror elements SE1. For example, in the light that enters the spatial light modulator S1, a light ray L1 falls on a mirror element SE1a, which is one of the plurality of mirror elements SE1 of the spatial light converter Si, and a light ray L2 falls on a mirror element SE1b, which is one of the plurality of mirror elements SE1 of the spatial light converter S1 differing from the mirror element SE1a. The mirror elements SE1a and SE1b respectively perform spatial modulation on the light rays L1 and L2 in accordance with their positions.

The prism P1 is arranged so that the air-equivalent length from incident positions IP1 and IP2 of the light rays L1 and L2 on the prism P1 via the mirror elements SE1a and SE1b to emission positions OP1 and OP2 from which light is emitted is equal to the air-equivalent length from positions corresponding to the incident positions IP1 and IP2 to positions corresponding to the emission positions OP1 and OP2 when the optical path of exposure light does not include the prism P1. The air-equivalent length is the optical path length when an optical path length in an optical system is converted to air having a refractive index of one. The air-equivalent length of a medium having refractive index n is obtained by multiplying the physical or actual optical path length of the medium by 1/n.

As shown in FIG. 3, the spatial light modulator S1 is a movable multi-mirror including a plurality of mirror elements SE1, which are microscopic reflection elements. Each of the mirror elements SE1 is movable and has a reflection surface. In each mirror element SE1, the orientation of the reflection surface, that is, the inclination angle and inclination direction of the reflection surface is independently driven and controlled by a spatial light modulator (SLM) drive unit 26, which is controlled by a control unit 20. Each mirror element SE1 is continuously rotatable by a desired rotation angle about two rotation axes that extend perpendicular to each other and parallel to the reflection surface. That is, the mirror elements SE1 are each controllable so as to inline two-dimensionally along the reflection surface. That is, the mirror elements SE1 are each controllable so as to inline two-dimensionally along the reflection surface. Here, the mirror elements SE1 have square outlines and are flat but are not limited in such a manner. However, from the viewpoint of light utilization efficiency, it is preferable that the mirror elements SE1 have outlines enabling an arrangement that eliminates gaps. It is also preferable that the gap between adjacent mirror elements SE1 be minimized. Further, it is preferable that the mirror elements SE1 be as small as possible so that fine changes can be made to the illumination conditions. Moreover, the reflection surfaces of the mirror elements SE1 do not have to be planar surfaces and may be curved surfaces such as concave surfaces and convex surfaces.

The spatial light modulator S1 is capable of performing modified illumination, which forms a desired light intensity distribution that is circular, annular, dipole-shaped, quadrupole-shaped, or the like at a pupil position (pupil surface) of an illumination optical system. Specifically, a storage unit 22, which is accessible by the control unit 20, stores information, for example, in the form of a lookup table, on the inclination angle and inclination direction of the mirror elements SE1 in the spatial light modulator S1 to form a light intensity distribution that is circular, annular, dipole-shaped, quadrupole-shaped, or the like at the pupil position of the illumination optical system. Based on the information on the inclination angle and inclination direction, the control unit 20 controls the SLM drive unit 26 and the inclination angle and inclination direction of each mirror element SE1 to form the light distribution with the desired shape at the pupil position of the illumination optical system or a position optically conjugated with the pupil position.

In the present embodiment, the spatial light modulator S1 is controlled so that the light distribution shape of incident light is transformed from a rectangular shape to an annular shape. The light that passes through the spatial light modulation unit SM1 enters the afocal lens 5 (relay optical system) and forms an annular light intensity distribution near a pupil position of the afocal lens 5 (and consequently the illumination optical system) or near the pupil position. The afocal lens 5 is an afocal system (non-focal optical system) in which its front focal point is located at the same position as the spatial light modulator S1 and its rear focal point is located at the same position as a predetermined plane 6, which is indicated by broken lines in the drawing. Accordingly, the light entering the spatial light modulator S1 forms an annular light intensity distribution at the pupil position of the afocal lens 5 and is then emitted from the afocal lens 5 as parallel light. In an optical path between a front lens group 5a and rear lens group 5b of the afocal lens 5, a conical axicon system 87, a first cylindrical lens pair 88, and a second cylindrical lens pair 89 are arranged at or near the pupil position of the illumination optical system from the light source side.

Figure 4:
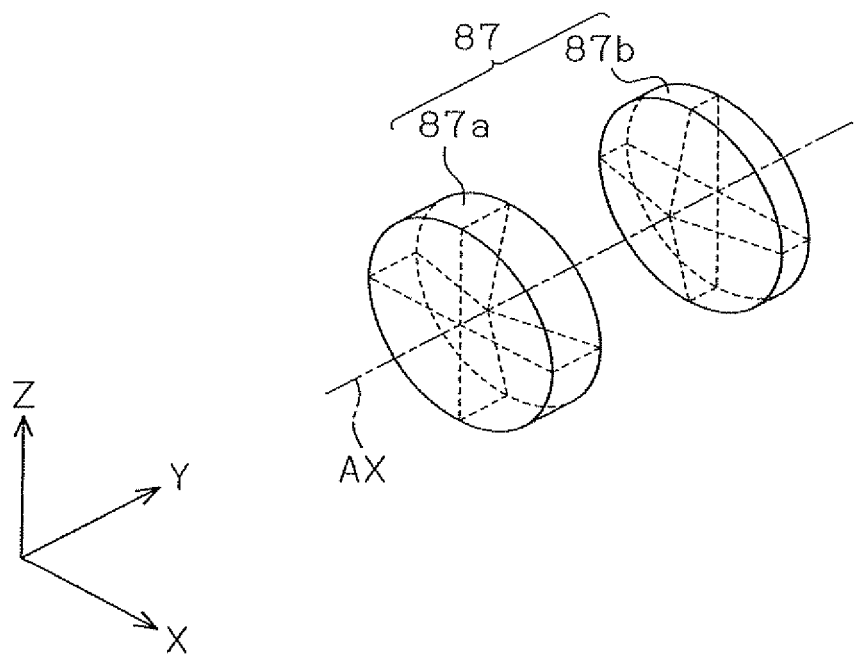
FIG. 4 is a schematic diagram showing the structure of a conical axicon system in an illumination optical system according to the embodiment.

FIG. 4 is a schematic diagram showing the conical axicon system 87, which is arranged at or near the pupil position of the illumination optical system. The conical axicon system 87 includes from the light source side a first prism 87a and a second prism 87b. The first prism 87a includes a concave, conical refraction surface (concave refraction surface). The second prism 87b includes a convex, conical refraction surface (convex refraction surface) that is formed to be complement so as to enable contact with the concave, conical refraction surface of the first prism 87a. The first prism 87a is arranged so that its planar surface faces toward the light source side and its concave, conical refraction surface faces toward a mask M. The second prism 87b is arranged so that its convex, conical refraction surface faces toward the light source and its planar surface faces toward the mask M.

At least either one of the first prism 87a and the second prism 87b is movable along the optical axis AX so that the interval between the concave, conical refraction surface of the first prism 87a and the convex, conical refraction surface of the second prism 87b (hereinafter, referred to as the interval of the conical axicon system 87) is variable. In a state in which the concave, conical refraction surface of the first prism 87a and the convex, conical refraction surface of the second prism 87b are in contact with each other, the conical axicon system 87 functions as a parallel planar plate and does not affect an annular secondary light source that is formed by a micro-lens array 10, which will be described later. However, when separating the concave, conical refraction surface of the first prism 87a and the convex, conical refraction surface of the second prism 87b, the conical axicon system 87 functions as a so-called beam expander. Accordingly, when varying the interval in the conical axicon system 87, the incident angle of the light entering the predetermined plane 6, which is indicated by the broken line in FIG. 1, is varied.

Figure 5A:
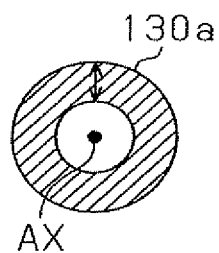
FIG. 5 is a diagram illustrating the operation of the conical axicon system with respect to a secondary light source formed through annular illumination according to the embodiment.
Figure 5B:
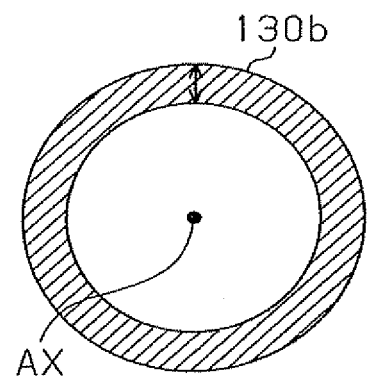

FIG. 5 includes drawings illustrating the operation of the conical axicon system 87 with respect to a secondary light source formed through annular illumination. FIG. 5(a) is a drawing showing an annular secondary light source 130a that is in the smallest state in which the interval in the conical axicon system 87 is zero and the focal length of a zoom lens 7, which will be described later, is set to a minimum value (hereinafter, referred to as the "standard state"). FIG. 5(b) is a drawing showing an annular secondary light source 130b formed in a state in which the interval in the conical axicon system 87 is increased to a predetermined value (the focal length of the zoom lens 7 is invariable). The width of the secondary light source 130b in the radial direction (a value that is ½ the difference between the outer diameter and inner diameter, indicated by the double-headed arrows in the drawings) is the same as the width of the secondary light source 130a in the radial direction. When increasing the interval in the conical axicon system 87 from zero to a predetermined value, the outer diameter and inner diameter of the annular secondary light source can be increased from the standard state while maintaining the same radial width of the annular secondary light source as the standard state. That is, the conical axicon system 87 functions to vary the annular ratio (inner diameter/outer diameter) and size (outer diameter) of the secondary light source without changing the radial width of the annular secondary light source.

Figure 6:
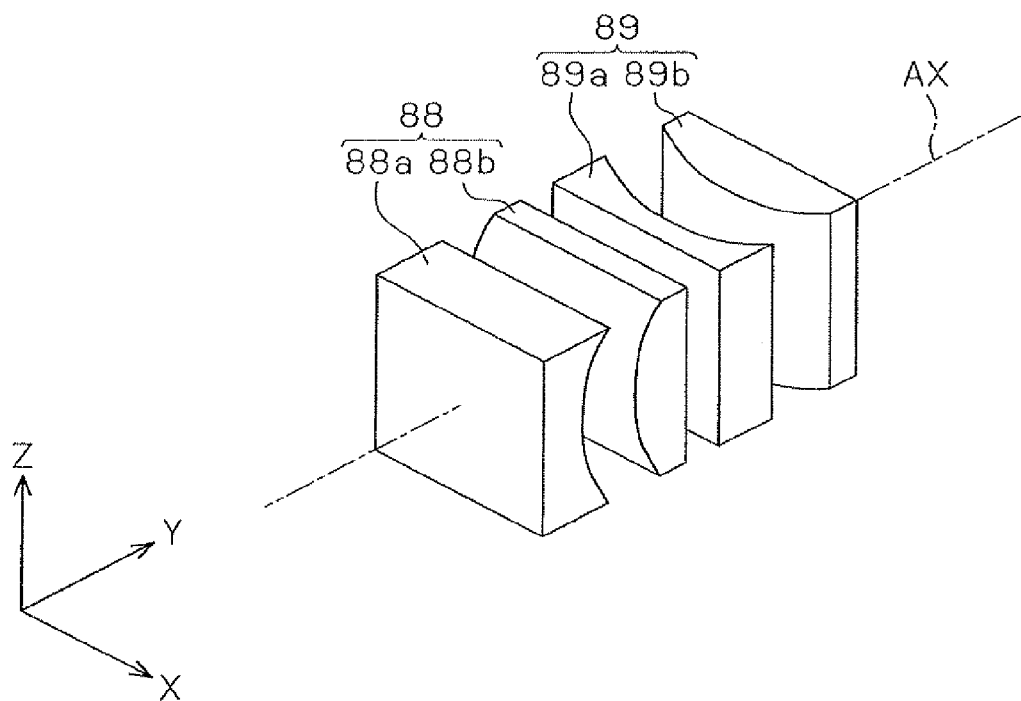
FIG. 6 is a schematic diagram showing a first cylindrical lens pair and a second cylindrical lens pair in the illumination optical system according to the embodiment.

FIG. 6 is a schematic diagram showing the first cylindrical lens pair 88 and the second cylindrical lens pair 89 arranged in an optical path between the front lens group 5a and rear lens group 5b of the afocal lens 5. As shown in FIG. 6, the first cylindrical lens pair 88 includes from the light source side a first cylindrical negative lens 88a, which has, for example, negative refractive power in a YZ plane and no refractive power in a XY plane, and a first cylindrical positive lens 88b, which has positive refraction power in a YZ plane and no refractive power in an XY plane. The second cylindrical lens pair 89 includes from the light source side a second cylindrical negative lens 89a, which has, for example, negative refractive power in an XY plane and no refractive power in a YZ plane, and a second cylindrical positive lens 89b, which has positive refraction power in an XY plane and no refractive power in a YZ plane.

The first cylindrical negative lens 88a and the first cylindrical positive lens 88b are formed so as to rotate integrally about the optical axis AX. In the same manner, the second cylindrical negative lens 89a and the second cylindrical positive lens 89b are formed so as to rotate integrally about the optical axis AX. The first cylindrical lens pair 88 functions as a beam expander having power in the Z direction, and the second cylindrical lens pair 89 functions as a beam expander having power in the X direction. Further, in the present embodiment, the first cylindrical lens pair 88 and the second cylindrical lens pair 89 are set to have the same power. Accordingly, the light that passes through the first cylindrical lens pair 88 and the second cylindrical lens pair 89 is subjected to a magnification effect resulting from the same powers in the Z direction and X direction.

The light that passes through the afocal lens 5 enters the zoom lens 7, which varies the σ value. The predetermined plane 6 is located at or near the front focal point of the zoom lens 7, and the micro-lens array 10, which will be described later, is arranged at or near the rear focal plane of the zoom lens 7. Thus, the zoom lens 7 arranges the predetermined plane 6 and the incidence surface of the micro-lens array 10 to substantially satisfy an optical Fourier transform relationship and consequently arranges the pupil position of the afocal lens 5 and the incidence surface of the micro-lens array 10 to be generally conjugated with each other. Accordingly, in the same manner as the pupil position of the afocal lens 5, for example, an annular illumination field is formed about the optical axis AX on the incidence surface of the micro-lens array 10. The entire shape of the annular illumination field varies in similarity in a manner dependent on the focal length of the zoom lens 7. That is, the size of the secondary light source (planar light source) formed at a position optically conjugated to the pupil position of the illumination optical system by the micro-lens array 10 is varied in similarity in a manner dependent on the focal length of the zoom lens 7 while keeping the amount of the illumination light emitted from the laser light source 1 substantially constant.

Figure 7A:
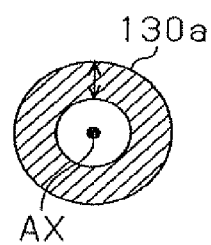
FIG. 7 is a diagram illustrating the operation of a zoom lens with respect to a secondary light source formed through the annular illumination according to the embodiment.
Figure 7B:
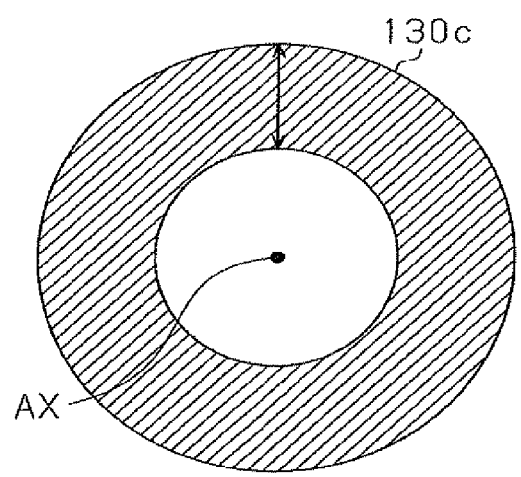

FIG. 7 includes drawings illustrating the operation of the zoom lens 7 with respect to the secondary light source formed by the annular illumination. FIG. 7(a) is a drawing showing the annular secondary light source 130a that is formed in the standard state, and FIG. 7(b) is a drawing showing an annular secondary light source 130c that is formed in a state in which the focal length of the zoom lens 7 is increased to a predetermined value (the interval of the conical axicon system 87 is invariable). Referring to FIGS. 7(a) and 7(b), when increasing the focal length of the zoom lens 7 from the minimum value to a predetermined value, the annular secondary light source 130a is transformed to the secondary light source 130c by magnifying the entire shape of the annular secondary light source 130a in similarity while keeping the amount of illumination light substantially constant. That is, the zoom lens 7 functions to vary the width and size (outer diameter) of the annular secondary light source without changing the annular ratio of the annular secondary light source. The light that passes through the zoom lens 7 enters a beam splitter 8. The light reflected by the beam splitter 8 enters a CCD imaging unit 9 (detection unit). The CCD imaging unit 9 sends an image signal to the control unit 20.

The light that passes through the beam splitter 8 enters the micro-lens array 10, which serves as an optical integrator. The incidence angle of the light entering the micro-lens array 10 varies in accordance with changes in the interval in the conical axicon system 87 in the same manner as the angle of the light entering the predetermined plane 6. The micro-lens array 10 is an optical device formed by a matrix of a plurality of densely arranged micro lenses having positive refractive power. Each micro lens of the micro-lens array 10 includes a rectangular cross-section, which is in similarity with the shape of the illumination field that is to be formed on the mask M (i.e., a plane to be irradiated or an irradiated plane) (consequently, the shape of the exposure region that is to be formed on a wafer W). The light entering the micro-lens array 10 is divided two-dimensionally by the plurality of micro lens so as to form at a rear focal plane (consequently, an illumination pupil) a secondary light source having generally the same light distribution as the illumination field forMed by the light entering micro-lens array 10, that is, a secondary light source, which is formed by a substantially annular planar light source extending about the optical axis AX.

Since in the present example the mask M located on an irradiated plane is illuminated by KOhler illumination, the plane on which this secondary light source is formed is a plane conjugate with an aperture stop of the projection optical system PL and can be called an illumination pupil plane of the illumination apparatus IL. Typically, the irradiated plane (the plane on which the mask M is arranged or the surface on which the wafer W is arranged) becomes an optical Fourier transform plane with respect to the illumination pupil plane. The pupil intensity distribution is a light intensity distribution on the illumination pupil plane of the illumination apparatus IL or on a plane conjugate with the illumination pupil plane. However, when the number of wavefront divisions by the micro-lens array 10 is large, an overall luminance distribution formed on the entrance surface of the micro-lens array 10 shows a high correlation with the overall intensity distribution of the entire secondary light source (pupil intensity distribution), and, therefore, the light intensity distributions on the entrance surface of the micro-lens array 10 and on a plane conjugate with the entrance surface can also be called pupil intensity distributions. Concerning such micro-lens array 10, reference can be made to U.S. Pat. No. 6,913,373, and U.S. Pat. Application Ser. No. 2008/0074631. The teachings of U.S. Pat. No. 6,913,373, and U.S. Pat. Application No. 2008/0074631 are hereby incorporated by reference. The micro-lens array 10 can be termed a micro fly's eye lens.

The light from the annular secondary light source formed on the rear focal plane of the micro-lens array 10 passes through an aperture stop 12, which can be arranged at or near the rear focal plane (emission plane) of the micro- lens array 10. The aperture stop 12 is formed, for example, by an iris stop or the like that limits the size of the secondary light source formed on the rear focal plane of the micro-lens array 10 to a predetermined size. The light beam that passes through the aperture stop 12 passes through a beam splitter 14 and a condenser lens 17a and illuminates a mask blind MB in a superimposed manner. The light reflected by the beam splitter 14 passes through a lens 15 and enters a photodiode 16. The photodiode 16 sends a detection signal to the control unit 20.

A rectangular illumination field, which is in accordance with the shape and focal length of each micro lens forming the micro-lens array 10, is formed in the mask blind MB, which serves as an illumination field stop. The light beam that passes through a rectangular aperture of the mask blind MB is subjected to a light converging operation of an imaging optical system 17b and then reflected by a reflection mirror 19 to illuminate in a superimposing manner the mask M, on which a predetermined pattern is formed. That is, the imaging optical system 17b forms an image of the rectangular aperture in the mask blind MB on the mask M, which is placed on a mask stage MS. The beam expander 2 to reflection mirror 19 and the spatial light modulation unit SM1 form an illumination optical system.

The light that passes through the pattern on the mask M forms a pattern image of the mask M on the wafer W, which is a photosensitive substrate. In this manner, the pattern of the mask M is sequentially exposed onto each exposure region in the mask by performing batch exposure or scan exposure while two-dimensionally drive-controlling the wafer W on a wafer stage WS in a plane that is orthogonal to the optical axis AX of the projection optical system PL.

The exposure apparatus of the present embodiment includes the diffuser that diffuses the illumination light entering the spatial light modulator, which forms the desired light intensity distribution at the pupil position of the illumination optical system or a position optically conjugated with the pupil position. Thus, based on the diffused illumination light, the desired light distribution can be formed by the spatial light modulator at the pupil position of the illumination optical system or a position optically conjugated with the pupil position. More specifically, when the light reflected by each mirror element of the spatial light modulator forms the desired light intensity distribution at the pupil position (pupil plane) of the illumination optical system, the light reflected by each mirror element is blurred at the pupil plane of the illumination optical system. This forms a spot that is larger than when the diffuser 4 is not used. Accordingly, illumination non-uniformity is not distinctive at the pupil position of the illumination optical system or a position optically conjugated with the pupil position. Further, the light distribution at the pupil position of the illumination optical system or a position optically conjugated with the pupil position may easily have various light distribution shapes and may easily be varied quickly and continuously to have the optimal light distribution shape. Thus, the pattern of a mask may be exposed onto a wafer with a high throughput and high resolution.

In the exposure apparatus of the present embodiment shown in FIG. 1, the CCD imaging unit 9 detects the light intensity distribution at the pupil position of the illumination optical system or a position optically conjugated with the pupil position. Further, in the exposure apparatus of the present embodiment, the exposure apparatus is arranged separately from a movable exposure stage (wafer stage WS), which holds a processed substrate such as the wafer W. A CCD imaging unit 39 is arranged on a measurement stage, which supports various measurement members and sensors. Based on light that passes through both of the illumination optical system and the projection optical system, the CCD imaging unit 39 detects the light intensity distribution at the pupil position of the illumination optical system (projection optical system) and a position optically conjugated with the pupil position. The employment of the CCD imaging unit 39 enables correction of influences resulting from optical characteristic variations that occur as time elapses in the projection optical system in addition to the illumination optical system. Such a CCD imaging unit is disclosed, for example, in U.S. Patent Publication No. 2008/0030707. An exposure apparatus including such a measurement stage is disclosed, for example, in Japanese Laid-Open Patent Publication No. 11-135400. The teachings of Japanese Laid-Open Patent Publication No. 11-135400 and U.S. Patent Application Publication No. 2008/0030707 are incorporated by reference.

Figure 8:
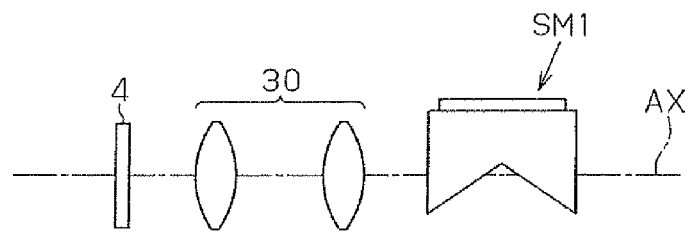
FIG. 8 is a diagram showing the structure of a further illumination optical system according to the embodiment.

In the exposure apparatus of the above-described embodiment, as shown in FIG. 8, from the viewpoint of effective use of the illumination light, it is preferable that an imaging optical system 30 be arranged between the diffuser 4 and the spatial light modulation unit SM1 to transform the illumination light diffused by the diffuser 4 to astringent light that enters the spatial light modulator S1 of the spatial light modulation unit SM1. In this case, it is further preferable that the diffuser 4 and the spatial light modulator Si of the spatial light modulation unit SM1 have an optically conjugated relationship.

The exposure apparatus of the above-described embodiment uses a diffuser that isotropically diffuses illumination light. This diffuser may be replaced by a diffuser having different diffusion characteristics (diffuser that anisotropically diffuses illumination light) to adjust the light distribution shape of the light intensity distribution formed at the pupil position of the illumination optical system. As such a diffuser, for example, a diffuser having different diffusion characteristics in the longitudinal direction and lateral direction may be used. This would enable the exposure of a pattern onto a wafer with high resolution and with a light intensity distribution corresponding to the pattern shape.

In the exposure apparatus of the above-described embodiment, a spatial light modulator that enables the orientation of two-dimensionally arranged reflection surfaces to be separately controlled is used as the spatial light modulator including a plurality of two-dimensionally arranged, separately controlled reflection elements. Examples of such a spatial light modulator are disclosed in Japanese National Phase Laid-Open Patent Publication No. 10-503300 and its corresponding European Patent Publication No. 779530, Japanese Laid-Open Patent Publication No. 2004-78136 and its corresponding U.S. Pat. No. 6,900,915, Japanese National Phase Laid-Open Patent Publication No. 2006-524349 and its corresponding U.S. Pat. No. 7,095,546, and Japanese Laid-Open Patent Publication No. 2006-113437. In these spatial light modulators, light that has passed through each reflection surface of the spatial light modulator enters a distribution formation optical system at a predetermined angle and forms a predetermined light intensity distribution on an illumination pupil plane in correspondence with a control signal sent to the plurality of optical elements. The teachings of European Patent Publication No. 779530, U.S. Pat. Nos. 6,900,915, and 7,095,546 are incorporated by reference.

Further, as the spatial light modulator, for example, a spatial light modulator enabling the height of two- dimensionally arranged reflection surfaces to be separately controlled may be used. Examples of such a spatial light modulator are disclosed in Japanese Laid-Open Patent Publication No. 6-281869 and its corresponding U.S. Pat. No. 5,312,513 and Japanese National Phase Laid-Open Patent Publication No. 2004-520618 and its corresponding U.S. Pat. No. 6,885,493 in FIG. 1d. In these spatial light modulators, the formation of a two-dimensional height distribution affects incident light in the same manner as a diffraction plane. The teachings of U.S. Pat. Nos. 5,312,513 and 6,885,493 are incorporated by reference.

The above-described spatial light modulator including a plurality of two-dimensionally arranged reflection surfaces may be modified in accordance with the disclosures of for example, Japanese National Phase Laid-Open Patent Publication No. 2006-513442 and its corresponding U.S. Pat. No. 6,891,655 and Japanese National Phase Laid-Open Patent Publication No. 2005-524112 and its corresponding U.S. Patent Application Publication No. 2005/0095749. The teachings of U.S. Pat. No. 6,891,655 and U.S. Patent Application Publication No. 2005/0095749 are incorporated by reference.

In the above-described embodiment, the diffuser 4 and the spatial light modulation unit SM1 is arranged at the downstream side of the deflection mirror 3. Instead, a spatial light modulator Si, which does not include a prism, may be arranged at the location of the deflection mirror 3, and the diffuser 4 may be arranged at the upstream side (light source side) of the spatial light modulator Si. Further, in the exposure apparatus of the above-described embodiment, an ArF excimer laser light source or a KrF excimer laser light source is used. However, an F2 laser light source may be used instead.

In the exposure apparatus of the above-described embodiment, a micro-device (semiconductor device, imaging device, liquid crystal display device, thin-film magnetic head, etc.) can be manufactured by illuminating a reticle (mask) with an illumination optical system and exposing a transfer pattern formed on a mask onto a photosensitive substrate (wafer) using the projection optical system (exposure process). One example of the procedures for obtaining a semiconductor device serving as the micro-device by forming a predetermined circuit pattern on a wafer etc, serving as the photosensitive substrate using the exposure apparatus of the present embodiment will be described below with reference to the flowchart of FIG. 9.

Figure 9:
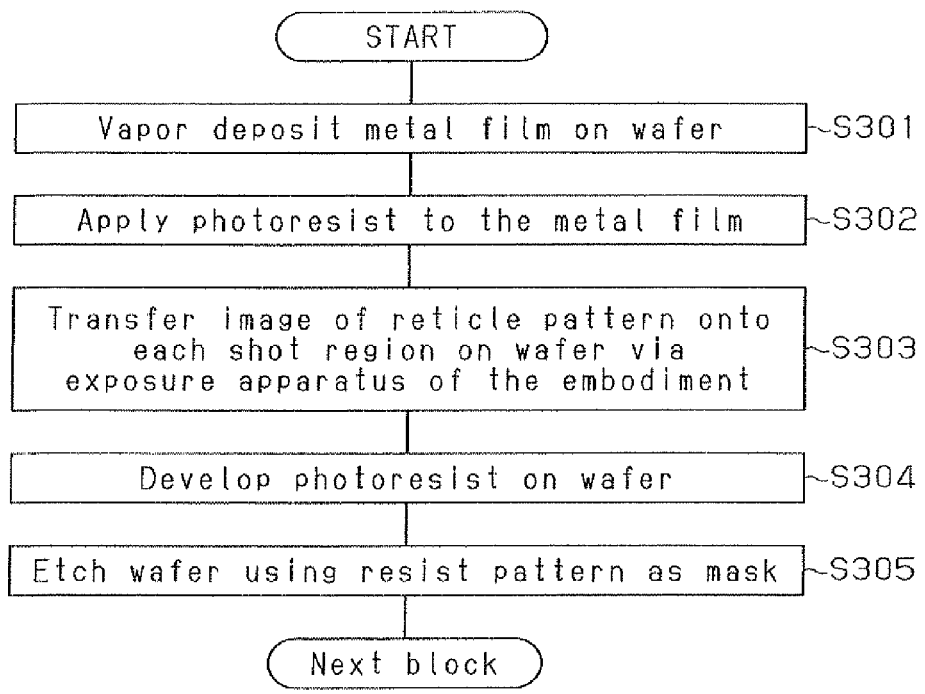
FIG. 9 is a flowchart illustrating a method for manufacturing a semiconductor device, which serves as a micro-device, according to the embodiment.

First, in block S301 of FIG. 9, a metal film is vapor-deposited onto a single lot of wafers. Next, in block S302, photoresist is applied to the metal film on the single lot of wafers. Then, in block S303, the image of a pattern on a mask is sequentially exposed and transferred to each shot region in the single lot of wafers with the projection optical system of the exposure apparatus of the present embodiment. After the photoresist on the single lot of wafers is developed in block S304, etching is carried out on the single lot of wafers using a resist pattern as the mask in block S305 so that a circuit pattern corresponding to the pattern on the mask is formed in each shot region of each wafer.

Subsequently, a device such as semiconductor device is manufactured by forming circuit patterns in upper layers. The micro-device manufacturing method described above uses the exposure apparatus of the above-described embodiment and thus obtains semiconductor devices having extremely fine circuit patterns with a high throughput. In block S301 to block S305, metal is vapor-deposited on the wafers, resist is applied to the metal film, and the processes of exposure, development, and etching are performed. However, it is obvious that prior to such processes, a silicon oxide film may be formed on the wafers. Then, resist may be applied o the silicon oxide film, and the processes of exposure, development, etching, and the like may be performed.

Figure 10:
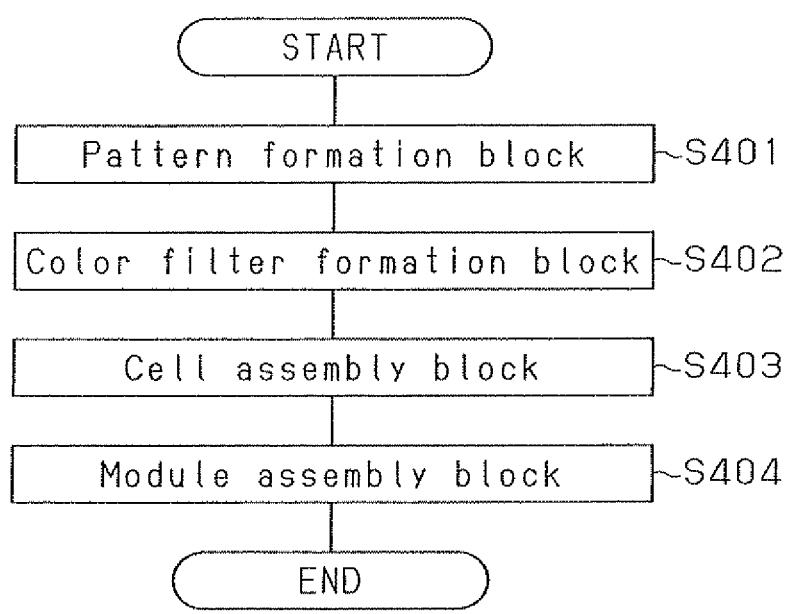
FIG. 10 is a flowchart illustrating a method for manufacturing a liquid crystal display device, which serves as a micro-device, according to the embodiment.

In the exposure apparatus of the present embodiment, a liquid crystal display device serving as a micro-device can be obtained by forming a predetermined pattern (circuit pattern, electrode pattern etc.) on a plate (glass substrate). One example of the procedures taken in this ease will now be described with reference to the flowchart of FIG. 10. In FIG. 10, a so-called photolithography block of transferring and exposing a pattern of a mask onto a photosensitive substrate (glass substrate coated with resist or the like) using the exposure apparatus of the above-described embodiment is performed in a pattern formation block 5401. A predetermined pattern including many electrodes or the like is formed on the photosensitive substrate through the photolithography block. The exposed substrate then undergoes blocks including a development block, an etching block, and a resist removal block to form a predetermined pattern on the substrate. Then, the next color filter formation block 5402 is performed.

In the color filter formation block 5402, a color filter is formed in which a plurality of sets of three dots corresponding to R (Red), G (Green), and B (Blue) are arranged in a matrix or in which a plurality of sets of three stripe filters of R, G, and B are arranged extending in a horizontal scanning line direction. After the color filter formation block 5402, a cell assembling block 5403 is performed. In the cell assembling block 5403, a liquid crystal panel (liquid crystal cell) is assembled using the substrate having the predetermined pattern obtained in the pattern formation block 5401 and the color filter obtained in the color filter formation block S402. In the cell assembling block S403, a liquid crystal panel (liquid crystal cell) is manufactured by injecting liquid crystal between the substrate having the predetermined pattern obtained in the pattern formation block S401 and the color filter obtained in the color filter formation block S402.

Thereafter, in a module assembling block S404, components such as electric circuits and a backlight for enabling a display operation of the assembled liquid crystal panel (liquid crystal cell) are mounted to complete a liquid crystal display device. In the above described manufacturing method for a liquid crystal display device, exposure is performed using the exposure apparatus of the above- described embodiment. Thus, semiconductor devices having extremely fine circuit patterns are obtained with a high throughput.

In the foregoing embodiments, it is also possible to apply a technique of filling the interior of the optical path between the projection optical system and the photosensitive substrate with a medium having the refractive index larger than 1.1 (typically, a liquid), which is so called a liquid immersion method. In this case, it is possible to adopt one of the following techniques as a technique of filing the interior of the optical path between the projection optical system and the photosensitive substrate with the liquid: the technique of locally filling the optical path with the liquid as disclosed in International Publication W099/49504; the technique of moving a stage holding the substrate to be exposed, in a liquid bath as disclosed in Japanese Patent Application Laid-open No. 6-124873; the technique of forming a liquid bath of a predetermined depth on a stage and holding the substrate therein as disclosed in Japanese Patent Application Laid-open No. 10-303114, and so on. International Publication W099/49504, Japanese Patent Application Laid-open No. 6-124873, and Japanese Patent Application Laid-open No. 10-303114 are incorporated as references herein.

In the foregoing embodiment, it is also possible to apply the so-called polarized illumination method disclosed in U.S. Pat. Published Application Nos. 2006/0203214, 2006/0170901, and 200-770146676. Teachings of the U.S Pat. Published Application Nos. 2006/0203214, 2006/0170901, and 2007/0146676 are incorporated herein by reference.

The application of the present invention is not limited to an exposure apparatus for manufacturing a semiconductor device. The present invention may also be applied to exposure apparatuses for a liquid crystal display device formed on a rectangular glass plate or for a display device such as a plasma display device. The present invention may also be widely applied to exposure apparatuses that manufacture various types of devices, such as an imaging device (CCD and the like), a micro-machine, a thin-film magnetic head, and a DNA chip. Further, the present invention may be applied to an exposure process (exposure apparatus) used when manufacturing various types of devices to form a mask (photomask, reticle, etc.) including a mask pattern during lithography.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. An illumination optical system which illuminates an irradiated plane with illumination light provided from a light source and which is used in combination with a projection optical system for projecting a pattern arranged on the irradiated plane onto a photosensitive substrate, the illumination optical system comprising:
   a diffuser which is arranged in an optical path of the illumination optical system and diffuses the illumination light incident on the diffuser;
   a spatial light modulator which is arranged between the diffuser and the irradiated plane and which includes a plurality of elements two-dimensionally arranged, each of the plurality of elements being controllable independently from one another and the plurality of elements receiving the illumination light diffused by the diffuser;
   a first optical system which is arranged in an optical path between the spatial light modulator and the irradiated plane and which distributes the light from the spatial light modulator to form a desirable light intensity distribution at a position optically conjugated with a pupil position of the projection optical system; and
   a second optical system which has an imaging optical system arranged in an optical path between the diffuser and the spatial light modulator.

2. The illumination optical system according to claim 1, wherein the second optical system transforms the illumination light diffused by the diffuser to astringent light and then guides the astringent light to the spatial light modulator.

3. The illumination optical system according to claim 1, wherein the second optical system conjugates the spatial light modulator with the diffuser.

4. The illumination optical system according to claim 1, wherein the diffuser has a diffusion characteristic that is changeable.

5. The illumination optical system according to claim 4, wherein the diffuser has the diffusion characteristic of isotropically diffusing the illumination light incident on the diffuser.

6. The illumination optical system according to claim 4, wherein the diffuser has the diffusion characteristic of anisotropically diffusing the illumination light incident on the diffuser.

7. The illumination optical system according to claim 1, wherein the first optical system has an optical surface array which two-dimensionally divides a light beam incident thereon.

8. The illumination optical system according to claim 7, wherein the optical surface array has a plurality of lens surface arrays.

9. The illumination optical system according to claim 7, further comprising a third optical system which illuminates the irradiated plane in a superimposed manner with light beams distributed by the first optical system.

10. An exposure apparatus which transfers a pattern of a mask onto a photosensitive substrate, the exposure apparatus comprising:
    the illumination optical system according to claim 1 which illuminates the mask that is arranged on the irradiated plane.

11. An illumination method which illuminates an irradiated plane with illumination light provided from a light source and which is used in combination with a projection optical system for projecting a pattern arranged on the irradiated plane onto a photosensitive substrate, the illumination method comprising:
    diffusing with a diffuser the illumination light from the light source;
    guiding the illumination light via the diffuser to a spatial light modulator which has a plurality of elements two-dimensionally arranged in a plane crossing an optical path of the illumination light, each of the plurality of elements being controllable independently from one another; and
    distributing the light from the spatial light modulator to form a desirable light intensity distribution at a position optically conjugated with a pupil position of the projection optical system,
    wherein the guiding of the illumination light to the spatial light modulator includes:
        guiding the illumination light via the diffuser to an imaging optical system; and
        guiding the illumination light via the imaging optical system to the spatial light modulator.

12. The illumination method according to claim 11, wherein the guiding of the illumination light to the spatial light modulator further includes:
    transforming the illumination light diffused by the diffuser to astringent light; and
    guiding the astringent light to the spatial light modulator.

13. The illumination method according to claim 11, wherein the imaging optical system conjugates the spatial light modulator with the diffuser.

14. The illumination method according to claim 11, wherein the diffuser has a diffusion characteristic that is changeable.

15. The illumination method according to claim 14, wherein the diffuser has the diffusion characteristic of isotropically diffusing the illumination light incident on the diffuser.

16. The illumination method according to claim 14, wherein the diffuser has the diffusion characteristic of anisotropically diffusing the illumination light incident on the diffuser.

17. The illumination method according to claim 11, wherein the distributing of the light from the spatial light modulator includes two-dimensionally dividing a light beam incident on the spatial light modulator.

18. The illumination method according to claim 17, wherein the two-dimensionally dividing of the light beam incident on the spatial light modulator includes two-dimensionally dividing the light beam incident thereon by using a plurality of lens surface arrays.

19. The illumination method according to claim 17, further comprising:
    illuminating the irradiated plane in a superimposed manner with light beams that are distributed.

20. An exposure method which transfers a pattern of a mask onto a photosensitive substrate, the exposure apparatus comprising:
 illuminating the mask that is arranged on an irradiated plane by using the illumination method according to claim 11.

21. A device manufacturing method comprising:
 exposing a pattern of a mask onto a photosensitive substrate by using the exposure method according to claim 20;
 developing the photosensitive substrate onto which the pattern has been transferred to form a mask layer shaped in correspondence with the pattern on a surface of the photosensitive substrate; and
 processing the surface of the photosensitive substrate through the mask layer.

* * * * *